(12) United States Patent
Tokuda et al.

(10) Patent No.: US 12,479,194 B2
(45) Date of Patent: Nov. 25, 2025

(54) LAMINATE

(71) Applicant: TOYOBO CO., LTD., Osaka (JP)

(72) Inventors: Kaya Tokuda, Otsu (JP); Satoshi Maeda, Otsu (JP); Tetsuo Okuyama, Otsu (JP); Harumi Yonemushi, Otsu (JP); Denichirou Mizuguchi, Otsu (JP)

(73) Assignee: TOYOBO CO., LTD., Osaka (JP)

( * ) Notice: Subject to any disclaimer, the term of this patent is extended or adjusted under 35 U.S.C. 154(b) by 103 days.

(21) Appl. No.: 18/263,100

(22) PCT Filed: Jun. 9, 2022

(86) PCT No.: PCT/JP2022/023330
§ 371 (c)(1),
(2) Date: Jul. 26, 2023

(87) PCT Pub. No.: WO2022/270325
PCT Pub. Date: Dec. 29, 2022

(65) Prior Publication Data
US 2024/0075718 A1 Mar. 7, 2024

(30) Foreign Application Priority Data
Jun. 22, 2021 (JP) .................. 2021-103545

(51) Int. Cl.
*B32B 27/08* (2006.01)
*B32B 3/30* (2006.01)
(Continued)

(52) U.S. Cl.
CPC .............. *B32B 27/08* (2013.01); *B32B 3/30* (2013.01); *B32B 7/06* (2013.01); *B32B 17/10* (2013.01);
(Continued)

(58) Field of Classification Search
CPC ....... B32B 17/10; B32B 27/16; B32B 27/281; B32B 27/34; B32B 27/36; H05K 1/0277;
(Continued)

(56) References Cited

U.S. PATENT DOCUMENTS

| 2003/0047280 A1 | 3/2003 | Takayama et al. |
| 2013/0251971 A1 | 9/2013 | Kataoka et al. |

(Continued)

FOREIGN PATENT DOCUMENTS

| CN | 1409374 A | 4/2003 |
| CN | 111849369 A | 10/2020 |

(Continued)

OTHER PUBLICATIONS

Japan Patent Office, International Search Report in International Patent Application No. PCT/JP2022/023330 (Aug. 23, 2022).
(Continued)

*Primary Examiner* — Zachary M Davis
(74) *Attorney, Agent, or Firm* — Leydig, Voit & Mayer, Ltd.

(57) ABSTRACT

The invention provides a laminate having a protective film release auxiliary tape and comprising a rigid temporary support body (inorganic substrate) and a polymer film provided with a protective film. The laminate is configured such that the protective film can be peeled from the polymer film without separating the polymer film from the temporary support body. The laminate comprises an inorganic substrate, a heat-resistant polymer film, a protective film, and a protective film release auxiliary tape in this order. The adhesion strength F1 according to a 90 degree peeling method between the inorganic substrate and the heat-resistant polymer film, the adhesion strength F2 according to a 90 degree peeling method between the heat-resistant polymer film and the protective film, and the adhesion strength F3
(Continued)

according to a 90 degree peeling method between the protective film and the protective film release auxiliary tape satisfy the relationship F3>F1>F2.

7 Claims, 3 Drawing Sheets

(51) Int. Cl.
　　*B32B 7/06*　　(2019.01)
　　*B32B 17/10*　　(2006.01)
　　*B32B 27/16*　　(2006.01)
　　*B32B 27/28*　　(2006.01)
　　*B32B 27/36*　　(2006.01)

(52) U.S. Cl.
　　CPC ............ *B32B 27/16* (2013.01); *B32B 27/281* (2013.01); *B32B 27/36* (2013.01); *B32B 2255/10* (2013.01); *B32B 2255/26* (2013.01); *B32B 2307/306* (2013.01); *B32B 2307/748* (2013.01)

(58) Field of Classification Search
　　CPC .... H05K 1/028; H05K 1/0283; H05K 1/0393; H05K 3/0011; H05K 3/0067; H05K 3/007; H10K 71/10; H10K 71/111
　　See application file for complete search history.

(56) References Cited

U.S. PATENT DOCUMENTS

| | | | |
|---|---|---|---|
| 2017/0225433 A1* | 8/2017 | Okuyama | ............... C03C 17/38 |
| 2021/0308987 A1 | 10/2021 | Okuyama et al. | |

FOREIGN PATENT DOCUMENTS

| CN | 112512792 A | 3/2021 |
|---|---|---|
| JP | 2002-018997 A | 1/2002 |
| JP | 2003-163338 A | 6/2003 |
| JP | 5152104 B2 | 2/2013 |
| JP | 2013-227533 A | 11/2013 |
| JP | 5699606 B2 | 4/2015 |
| JP | 2020-100026 A | 7/2020 |

OTHER PUBLICATIONS

Japan Patent Office, International Preliminary Report on Patentability in International Patent Application No. PCT/JP2022/023330 (Dec. 14, 2023).
European Patent Office, Extended European Search Report in European Patent Application No. 22828242.2 (Mar. 24, 2025).
China National Intellectual Property Administration, Office Action in Chinese Patent Application No. 202280033122.3 (Jun. 6, 2025).
China National Intellectual Property Administration, Office Action in Chinese Patent Application No. 202280033122.3 (Sep. 18, 2025).

* cited by examiner

LAMINATE

TECHNICAL FIELD

The present invention is an invention relating to a laminate of an inorganic substrate, a polymer film layer with protective film, and a protective film peeling auxiliary tape.

BACKGROUND ART

As substrate materials for the manufacture of flexible electronic devices, the use of heat-resistant polymer films such as polyimide (hereinafter also simply referred to as "polymer films") has been studied. Since these polymer films such as polyimide are manufactured in long roll shapes, it is generally accepted that a roll-to-roll manufacturing line is ideal for the manufacture of flexible devices as well.

Meanwhile, in a large number of conventional electronic devices such as display devices, sensor arrays, touch screens and printed wiring boards, hard and rigid substrates such as glass substrates, semiconductor wafers, or glass fiber reinforced epoxy substrates are used, and the manufacturing equipment is also configured on the premise of using such rigid substrates.

Based on this background, as a technique of manufacturing flexible electronic devices using existing manufacturing equipment, there are known techniques of manufacturing flexible electronic devices in the procedure of handling a polymer film in a state of being temporarily pasted to a rigid inorganic substrate such as a glass substrate used as a temporary support, processing an electronic device on the polymer film, and then peeling off the polymer film on which the electronic device is formed from the temporary support. (Patent Document 1)

As a technique of manufacturing flexible electronic devices using existing manufacturing equipment, there are known techniques of manufacturing flexible electronic devices by applying a polymer solution or a polymer precursor solution to a rigid substrate such as a glass substrate used as a temporary support, and drying the solution to form a precursor film, then converting the precursor into a polymer film by causing a chemical reaction to obtain a laminate of a temporary support and a polymer film, forming an electronic device on the polymer film in the same manner, and then peeling off the polymer film. (Patent Document 2)

However, in the process of forming a desired functional element on a laminate in which a polymer film and a support formed of an inorganic substance are bonded together, the laminate is often exposed to a high temperature. For example, in the formation of functional elements such as polysilicon and oxide semiconductors, a step performed in a temperature region of about 200° C. to 600° C. is required. A temperature of about 200° C. to 300° C. may be applied to the film in the fabrication of a hydrogenated amorphous silicon thin film, and further heating at about 450° C. to 600° C. may be required in order to heat and dehydrogenate amorphous silicon and obtain low-temperature polysilicon. Hence, the polymer film constituting the laminate is required to exhibit heat resistance, but as a matter of fact, polymer films which can withstand practical use in such a high temperature region are limited, and polyimide is selected in many cases.

In other words, in any technique, a laminate in a state where a rigid temporary support and a polymer film layer that is finally peeled off and becomes the base material of a flexible electronic device are superimposed one on the other is used. The laminate can be handled as a rigid plate material, and can be thus handled in the same manner as a glass substrate in equipment for manufacturing liquid crystal displays, plasma displays, organic EL displays, or the like using conventional glass substrates.

PRIOR ART DOCUMENTS

Patent Documents

Patent Document 1: JP-B-5152104
Patent Document 2: JP-B-5699606

SUMMARY OF THE INVENTION

Problems to be Solved by the Invention

Conventional rigid inorganic substrates such as glass substrates are handled in the form of stacks of multiple substrates during storage or transportation. When stacked, a cushioning material such as a foamed polymer sheet or paper is sandwiched between the inorganic substrates so that the inorganic substrates are easily taken out from the stack after storage or transportation. The method is adoptable to glass substrates having sufficient surface hardness. However, in the laminate of an inorganic substrate (temporary supporting substrate) and a polymer film handled by the present invention, since the surface hardness of the polymer film is insufficient, the polymer film surface and the inorganic substrate surface of the laminate are rubbed against each other and the soft polymer film surface is damaged when the laminate is stacked. Furthermore, in a case where a cushioning material such as a foamed polymer sheet or paper is used as well, the polymer film surface is likely to be damaged by foreign matter that is mixed in.

A commonly used method for solving such problems is a technique of protecting the polymer film surface with a protective film. Generally, the protective film is slightly pressure sensitive adhesive films in which pressure sensitive adhesive materials exhibiting weak adhesive properties are applied to one surface of relatively inexpensive polymer films such as polyethylene, polypropylene, and polyester. From the viewpoint of being able to reduce the cost, the protective film may be resin films exhibiting self-adsorptive properties such as polyolefin-based resins.

By using the protective films, it is possible to prevent the polymer film surface from being damaged and to maintain a polymer film surface suitable for the formation of fine flexible electronic device.

However, the present inventors have faced a problem that it is difficult to peel off the protective film from the polymer film without peeling off the inorganic substrate and the polymer film when the protective film is peeled off from a laminate of a polymer film with protective film and an inorganic substrate. The laminate of an inorganic substrate and a polymer film of the present invention is laminated with a weak adhesive force so as to be finally peeled off after a device is fabricated on the polymer film surface. For this reason, if the peel strength between the polymer film and the protective film is equal to or greater than the peel strength between the inorganic substrate and the polymer film, it is difficult to peel off only the protective film.

The problem to be solved by the present invention is to provide a laminate with protective film peeling auxiliary tape in which the protective film can be peeled off from the polymer film without peeling off the polymer film and the temporary support (inorganic substrate) from the laminate including a polymer film with protective film and a rigid temporary support (inorganic substrate).

Means for Solving the Problems

In other words, the present invention includes the following configurations.

[1] A laminate including an inorganic substrate, a heat-resistant polymer film, a protective film, and a protective film peeling auxiliary tape in this order, in which adhesive strength F1 between the inorganic substrate and the heat-resistant polymer film by a 90-degree peeling method, adhesive strength F2 between the heat-resistant polymer film and the protective film by a 90-degree peeling method, and adhesive strength F3 between the protective film and the protective film peeling auxiliary tape by a 90-degree peeling method satisfy relation of F3>F1>F2 (1).

[2] The laminate according to [1], in which an ultraviolet 50% cutoff wavelength of the protective film is 240 nm or more.

[3] The laminate according to [1] or [2], in which a change rate of F2 after heating of the laminate at 120° C. for 10 minutes is 50% or less.

[4] The laminate according to any one of [1] to [3], in which an area B1 of the protective film and an area B2 of the protective film peeling auxiliary tape satisfy relation of B1>B2.

[5] The laminate according to any one of [1] to [4], in which an arithmetic mean waviness Wa of a surface of the protective film in contact with the heat-resistant polymer film is 30 nm or less.

[6] The laminate according to any one of [1] to [5], in which the heat-resistant polymer film includes at least one selected from the group consisting of polyimide, polyamide, and polyamide-imide.

[7] The laminate according to any one of [1] to [5], in which the heat-resistant polymer film is transparent polyimide.

Effect of the Invention

In a laminate including a polymer film with protective film and a rigid temporary support (inorganic substrate), only the protective film can be easily peeled off without peeling off the inorganic substrate and the polymer film in both cases of manual peeling and mechanical peeling by setting the adhesive strength F1 between the inorganic substrate and the polymer film to be greater than the adhesive strength F2 between the polymer film and the protective film and further setting the adhesive strength F3 between the protective film and the protective film peeling auxiliary tape to be greater than the adhesive strength F1 between the inorganic substrate and the polymer film.

MODE FOR CARRYING OUT THE INVENTION

Figure 1:
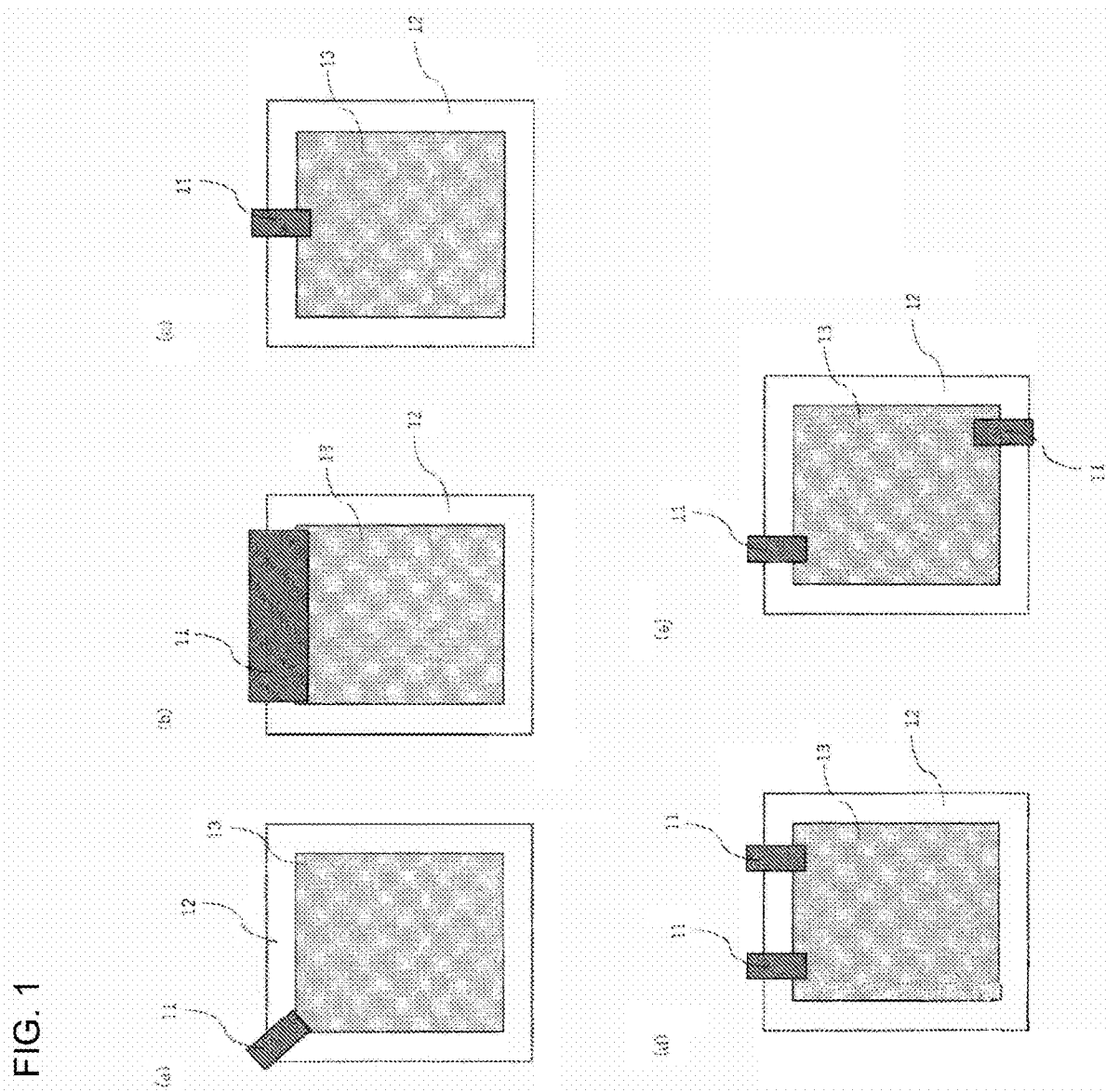
FIGS. 1(a) to 1(e) are schematic diagrams of a laminate (inorganic substrate/heat-resistant polymer film/protective film/protective film peeling auxiliary tape) according to the present invention.

Hereinafter, an embodiment of the present invention (hereinafter abbreviated as "embodiment") will be described in detail. It should be noted that the present invention is not limited to the following embodiments, and various modifications can be made within the scope of the gist of the present invention.

<Heat-Resistant Polymer Film>

Examples of the heat-resistant polymer film (hereinafter, also simply referred to as polymer film) includes films of polyimide-based resins (for example, aromatic polyimide resin and alicyclic polyimide resin) such as polyimide, polyamide-imide, polyetherimide, and fluorinated polyimide; polyolefin-based resins such as polyethylene and polypropylene; copolymerized polyesters (for example, fully aromatic polyesters and semi-aromatic polyesters) such as polyethylene terephthalate, polybutylene terephthalate, and polyethylene-2,6-naphthalate; copolymerized (meth)acrylates represented by polymethylmethacrylate; polycarbonates; polyamides; polysulfones; polyethersulfones; polyetherketones; cellulose acetates; cellulose nitrates; aromatic polyamides; polyvinyl chloride; polyphenols; polyarylates; polyphenylene sulfides; polyphenylene oxides; and polystyrenes.

However, since the polymer film is premised on being used in a process involving heat treatment at 300° C. or more, those that can actually be adopted among the exemplified polymer films are limited. Among the polymer films, films obtained using so-called super engineering plastics are preferable, and more specific examples thereof include polyimide-based resins, polyamide-based resins, polyamide-imide-based resins, and azole-based resins. Particularly preferred specific examples thereof include aromatic polyimide films, aromatic amide films, aromatic amide-imide films, aromatic benzoxazole films, aromatic benzothiazole films, and aromatic benzimidazole films.

The details of the polyimide-based resin films (referred to as polyimide films in some cases) which are an example of the polymer film will be described below. Generally, a polyimide-based resin film is obtained by applying a polyamic acid (polyimide precursor) solution which is obtained by a reaction between a diamine and a tetracarboxylic acid in a solvent, to a support for polyimide film fabrication, drying the solution to form a green film (hereinafter, also called as a "polyamic acid film"), and treating the green film by heat at a high temperature to cause a dehydration ring-closure reaction on the support for polyimide film fabrication or in a state of being peeled off from the support.

For the application of the polyamic acid (polyimide precursor) solution, it is possible to appropriately use, for example, conventionally known solution application means such as spin coating, doctor blade, applicator, comma coater, screen printing method, slit coating, reverse coating, dip coating, curtain coating, and slit die coating.

Diamines constituting polyamic acid are not particularly limited, and aromatic diamines, aliphatic diamines, alicyclic diamines and the like that are commonly used in polyimide synthesis may be used. From the viewpoint of heat resistance, aromatic diamines are preferable. The diamines can be used singly or in combination of two or more kinds thereof.

The diamines are not particularly limited, and examples thereof include oxydianiline (bis(4-aminophenyl) ether and para-phenylenediamine (1,4-phenylenediamine).

As tetracarboxylic acids constituting polyamic acid, aromatic tetracarboxylic acids (including anhydrides thereof), aliphatic tetracarboxylic acids (including anhydrides thereof) and alicyclic tetracarboxylic acids (including anhydrides thereof), which are usually used for polyimide synthesis, can be used. In a case where these are acid anhydrides, the acid anhydrides may have one anhydride structure or two anhydride structures in the molecule, but one (dianhydride) having two anhydride structures in the molecule is preferable. The tetracarboxylic acids may be used singly or in combination of two or more kinds thereof.

The tetracarboxylic acid is not particularly limited, and examples thereof include pyrolimetic dianhydride and 3,3',4,4'-biphenyltetracarboxylic dianhydride.

The polyimide film may be a transparent polyimide film.

Colorless and transparent polyimide, which is an example of the polymer film, will be described. In order to avoid complication, colorless and transparent polyimide is simply referred to as transparent polyimide. As the transparency of transparent polyimide, it is preferable that the total light transmittance is 75% or more. The total light transmittance is more preferably 80% or more, still more preferably 85% or more, yet still more preferably 87% or more, particularly preferably 88% or more. The upper limit of the total light transmittance of transparent polyimide is not particularly limited, but is preferably 98% or less, more preferably 97% or less for use as a flexible electronic device. The colorless and transparent polyimide in the present invention is preferably polyimide having a total light transmittance of 75% or more.

Examples of the aromatic tetracarboxylic acids for obtaining highly colorless and transparent polyimide include tetracarboxylic acids such as 4,4'-(2,2-hexafluoroisopropylidene)diphthalic acid, 4,4'-oxydiphthalic acid, bis(1,3-dioxo-1,3-dihydro-2-benzofuran-5-carboxylic acid) 1,4-phenylene, bis(1,3-dioxo-1,3-dihydro-2-benzofuran-5-yl) benzene-1,4-dicarboxylate, 4,4'-[4,4'-(3-oxo-1,3-dihydro-2-benzofuran-1,1-diyl) bis(benzene-1,4-diyloxy)]dibenzene-1,2-dicarboxylic acid, 3,3',4,4'-benzophenonetetracarboxylic acid, 4,4'-[(3-oxo-1,3-dihydro-2-benzofuran-1,1-diyl) bis(toluene-2,5-diyloxy)] dibenzene-1,2-dicarboxylic acid, 4,4'-[(3-oxo-1,3-dihydro-2-benzofuran-1,1-diyl) bis(1,4-xylene-2,5-diyloxy)] dibenzene-1,2-dicarboxylic acid, 4,4'-[4,4'-(3-oxo-1,3-dihydro-2-benzofuran-1,1-diyl) bis(4-isopropyl-toluene-2,5-diyloxy)]dibenzene-1,2-dicarboxylic acid, 4,4'-[4,4'-(3-oxo-1,3-dihydro-2-benzofuran-1,1-diyl) bis(naphthalene-1,4-diyloxy)]dibenzene-1,2-dicarboxylic acid, 4,4'-[4,4'-(3H-2,1-benzoxathiol-1,1-dioxide-3,3-diyl) bis(benzene-1,4-diyloxy)]dibenzene-1,2-dicarboxylic acid, 4,4'-benzophenone tetracarboxylic acid, 4,4'-[(3H-2,1-benzoxathiol-1,1-dioxide-3,3-diyl) bis(toluene-2,5-diyloxy)]dibenzene-1,2-dicarboxylic acid, 4,4'-[(3H-2,1-benzoxathiol-1,1-dioxide-3,3-diyl) bis(1,4-xylene-2,5-diyloxy)]dibenzene-1,2-dicarboxylic acid, 4,4'-[4,4'-(3H-2,1-benzoxathiol-1,1-dioxide-3,3-diyl) bis(4-isopropyl-toluene-2,5-diyloxy)]dibenzene-1,2-dicarboxylic acid, 4,4'-[4,4'-(3H-2,1-benzoxathiol-1,1-dioxide-3,3-diyl) bis(naphthalene-1,4-diyloxy)]dibenzene-1,2-dicarboxylic acid, 3,3',4,4'-benzophenonetetracarboxylic acid, 3,3',4,4'-benzophenonetetracarboxylic acid, 3,3',4,4'-diphenylsulfonetetracarboxylic acid, 3,3',4,4'-biphenyltetracarboxylic acid, 2,3,3',4'-biphenyltetracarboxylic acid, pyromellitic acid, 4,4'-[spiro(xanthene-9,9'-fluorene)-2,6-diyl bis(oxycarbonyl)] diphthalic acid, and 4,4'-[spiro(xanthene-9,9'-fluorene)-3,6-diyl bis(oxycarbonyl)] diphthalic acid, and acid anhydrides thereof. Among these, dianhydrides having two acid anhydride structures are suitable, and particularly 4,4'-(2,2-hexafluoroisopropylidene)diphthalic dianhydride and 4,4'-oxydiphthalic dianhydride are preferable. The aromatic tetracarboxylic acids may be used singly or in combination of two or more kinds thereof. For obtaining high heat resistance, the amount of the aromatic tetracarboxylic acids copolymerized is, for example, preferably 50% by mass or more, more preferably 60% by mass or more, still more preferably 70% by mass or more, yet still more preferably 80% by mass or more, particularly preferably 90% by mass or more of the total amount of all the tetracarboxylic acids, and may be 100% by mass.

Examples of the alicyclic tetracarboxylic acids include tetracarboxylic acids such as 1,2,3,4-cyclobutanetetracarboxylic acid, 1,2,3,4-cyclopentanetetracarboxylic acid, 1,2,3,4-cyclohexanetetracarboxylic acid, 1,2,4,5-cyclohexanetetracarboxylic acid, 3,3',4,4'-bicyclohexyltetracarboxylic acid, bicyclo[2,2,1]heptane-2,3,5,6-tetracarboxylic acid, bicyclo[2,2,2]octane-2,3,5,6-tetracarboxylic acid, bicyclo[2,2,2]octo-7-ene-2,3,5,6-tetracarboxylic acid, tetrahydroanthracene-2,3,6,7-tetracarboxylic acid, tetradecahydro-1,4:5,8:9,10-trimethanoanthracene-2,3,6,7-tetracarboxylic acid, decahydronaphthalene-2,3,6,7-tetracarboxylic acid, decahydro-1,4:5,8-dimethanonaphthalene-2,3,6,7-tetracarboxylic acid, decahydro-1,4-ethano-5,8-methanonaphthalene-2,3,6,7-tetracarboxylic acid, norbornane-2-spiro-α-cyclopentanone-α'-spiro-2"-norbornane-5,5",6,6"-tetracarboxylic acid (also known as "norbornane-2-spiro-2'-cyclopentanone-5'-spiro-2"-norbornane-5,5",6,6"-tetracarboxylic acid"), methylnorbornane-2-spiro-α-cyclopentanone-α'-spiro-2"-(methylnorbornane)-5,5",6,6"-tetracarboxylic acid, norbornane-2-spiro-α-cyclohexanone-α'-spiro-2"-norbornane-5,5",6,6"-tetracarboxylic acid (also known as "norbornane-2-spiro-2'-cyclohexanone-6'-spiro-2"-norbornane-5,5",6,6"-tetracarboxylic acid"), methylnorbornane-2-spiro-α-cyclohexanone-α'-spiro-2"-(methylnorbornane)-5,5",6,6"-tetracarboxylic acid, norbornane-2-spiro-α-cyclopropanone-α'-spiro-2"-norbornane-5,5",6,6"-tetracarboxylic acid, norbornane-2-spiro-α-cyclobutanone-α'-spiro-2"-norbornane-5,5",6,6"-tetracarboxylic acid, norbornane-2-spiro-α-cycloheptanone-α'-spiro-2"-norbornane-5,5",6,6"-tetracarboxylic acid, norbornane-2-spiro-α-cyclooctanone-α'-spiro-2"-norbornane-5,5",6,6"-tetracarboxylic acid, norbornane-2-spiro-α-cyclononanone-α'-spiro-2"-norbornane-5,5",6,6"-tetracarboxylic acid, norbornane-2-spiro-α-cyclodecanone-α'-spiro-2"-norbornane-5,5",6,6"-tetracarboxylic acid, norbornane-2-spiro-α-cycloundecanone-α'-spiro-2"-norbornane-5,5",6,6"-tetracarboxylic acid, norbornane-2-spiro-α-cyclododecanone-α'-spiro-2"-norbornane-5,5",6,6"-tetracarboxylic acid, norbornane-2-spiro-α-cyclotridecanone-α'-spiro-2"-norbornane-5,5",6,6"-tetracarboxylic acid, norbornane-2-spiro-α-cyclotetradecanone-α'-spiro-2"-norbornane-5,5",6,6"-tetracarboxylic acid, norbornane-2-spiro-α-cyclopentadecanone-α'-spiro-2"-norbornane-5,5",6,6"-tetracarboxylic acid, norbornane-2-spiro-α-(methylcyclopentanone)-α'-spiro-2"-norbornane-5,5",6,6"-tetracarboxylic acid, and norbornane-2-spiro-α-(methylcyclohexanone)-α'-spiro-2"-norbornane-5,5",6,6"-tetracarboxylic acid, and acid anhydrides thereof. Among these, dianhydrides having two acid anhydride structures are suitable, particularly 1,2,3,4-cyclobutanetetracarboxylic dianhydride, 1,2,3,4-cyclohexanetetracarboxylic dianhydride, and 1,2,4,5-cyclohexanetetracarboxylic dianhydride are preferable, 1,2,3,4-cyclobutanetetracarboxylic dianhydride and 1,2,4,5-cyclohexanetetracarboxylic dianhydride are more preferable, and 1,2,3,4-cyclobutanetetracarboxylic dianhydride is still more preferable. These may be used singly or in combination of two or more kinds thereof. For obtaining high transparency, the amount of the aromatic tetracarboxylic acids copolymerized is, for example, preferably 50% by mass or more, more preferably 60% by mass or more, still more preferably 70% by mass or more, yet still more preferably 80% by mass or more, particularly preferably 90% by mass or more of the total amount of all the tetracarboxylic acids, and may be 100% by mass.

Examples of the tricarboxylic acids include aromatic tricarboxylic acids such as trimellitic acid, 1,2,5-naphthalenetricarboxylic acid, diphenyl ether-3,3',4'-tricarboxylic acid, and diphenylsulfone-3,3',4'-tricarboxylic acid, or hydrogenated products of the aromatic tricarboxylic acids such as hexahydrotrimellitic acid, and alkylene glycol bistrimellitates such as ethylene glycol bistrimellitate, propylene glycol bistrimellitate, 1,4-butanediol bistrimellitate, and polyethylene glycol bistrimellitate and monoanhydrides and esterified products thereof. Among these, monoanhydrides having one acid anhydride structure are suitable, and particularly trimellitic anhydride and hexahydrotrimellitic anhydride are preferable. These may be used singly or a plurality of these may be used in combination.

Examples of the dicarboxylic acids include aromatic dicarboxylic acids such as terephthalic acid, isophthalic acid, orthophthalic acid, naphthalenedicarboxylic acid, and 4,4'-oxydibenzenecarboxylic acid, or hydrogenated products of the aromatic dicarboxylic acids such as 1,6-cyclohexanedicarboxylic acid, and oxalic acid, succinic acid, glutaric acid, adipic acid, heptanedioic acid, octanedioic acid, azelaic acid, sebacic acid, undecanedioic acid, dodecanedioic acid, and 2-methylsuccinic acid and acid chlorides or esterified products thereof. Among these, aromatic dicarboxylic acids and hydrogenated products thereof are suitable, and particularly terephthalic acid, 1,6-cyclohexanedicarboxylic acid, and 4,4'-oxydibenzenecarboxylic acid are preferable. The dicarboxylic acids may be used singly or a plurality of these may be used in combination.

The diamines or isocyanates for obtaining highly colorless and transparent polyimide are not particularly limited, and it is possible to use aromatic diamines, aliphatic diamines, alicyclic diamines, aromatic diisocyanates, aliphatic diisocyanates, alicyclic diisocyanates and the like that are usually used in the polyimide synthesis, polyamide-imide synthesis, and polyamide synthesis. Aromatic diamines are preferable from the viewpoint of heat resistance, and alicyclic diamines are preferable from the viewpoint of transparency. When aromatic diamines having a benzoxazole structure are used, a high elastic modulus, low heat shrinkability, and a low coefficient of linear thermal expansion as well as high heat resistance can be exerted. The diamines and isocyanates may be used singly or in combination of two or more kinds thereof.

Examples of the aromatic diamines include: 2,2'-dimethyl-4,4'-diaminobiphenyl; 1,4-bis[2-(4-aminophenyl)-2-propyl]benzene; 1,4-bis(4-amino-2-trifluoromethylphenoxy)benzene; 2,2'-ditrifluoromethyl-4,4'-diaminobiphenyl; 4,4'-bis(4-aminophenoxy)biphenyl; 4,4'-bis(3-aminophenoxy)biphenyl; bis[4-(3-aminophenoxy)phenyl]ketone; bis[4-(3-aminophenoxy)phenyl]sulfide; bis[4-(3-aminophenoxy)phenyl]sulfone; 2,2-bis[4-(3-aminophenoxy)phenyl]propane; 2,2-bis[4-(3-aminophenoxy)phenyl]-1,1,1,3,3,3-hexafluoropropane; m-phenylenediamine; o-phenylenediamine; p-phenylenediamine; m-aminobenzylamine; p-aminobenzylamine; 4-amino-N-(4-aminophenyl)benzamide; 3,3'-diaminodiphenylether; 3,4'-diaminodiphenylether; 4,4'-diaminodiphenylether; 2,2'-trifluoromethyl-4,4'-diaminodiphenylether; 3,3'-diaminodiphenylsulfide; 3,4'-diaminodiphenylsulfide; 4,4'-diaminodiphenylsulfide; 3,3'-diaminodiphenylsulfoxide; 3,4'-diaminodiphenylsulfoxide; 4,4'-diaminodiphenylsulfoxide; 3,3'-diaminodiphenyl sulfone; 3,4'-diaminodiphenyl sulfone; 4,4'-diaminodiphenyl sulfone; 3,3'-diaminobenzophenone; 3,4'-diaminobenzophenone; 4,4'-diaminobenzophenone; 3,3'-diaminodiphenylmethane; 3,4'-diaminodiphenylmethane; 4,4'-diaminodiphenylmethane; bis[4-(4-aminophenoxy)phenyl]methane; 1,1-bis[4-(4-aminophenoxy)phenyl]ethane; 1,2-bis[4-(4-aminophenoxy)phenyl]ethane; 1,1-bis[4-(4-aminophenoxy)phenyl]propane; 1,2-bis[4-(4-aminophenoxy)phenyl]propane; 1,3-bis[4-(4-aminophenoxy)phenyl]propane; 2,2-bis[4-(4-aminophenoxy)phenyl]propane; 1,1-bis[4-(4-aminophenoxy)phenyl]butane; 1,3-bis[4-(4-aminophenoxy)phenyl]butane; 1,4-bis[4-(4-aminophenoxy)phenyl]butane; 2,2-bis[4-(4-aminophenoxy)phenyl]butane; 2,3-bis[4-(4-aminophenoxy)phenyl]butane; 2-[4-(4-aminophenoxy)phenyl]-2-[4-(4-aminophenoxy)-3-methylphenyl]propane; 2,2-bis[4-(4-aminophenoxy)-3-methylphenyl]propane; 2-[4-(4-aminophenoxy)phenyl]-2-[4-(4-aminophenoxy)-3,5-dimethylphenyl]propane; 2,2-bis[4-(4-aminophenoxy)-3,5-dimethylphenyl]propane; 2,2-bis[4-(4-aminophenoxy)phenyl]-1,1,1,3,3,3-hexafluoropropane; 1,4-bis(3-aminophenoxy)benzene; 1,3-bis(3-aminophenoxy)benzene; 1,4-bis(4-aminophenoxy)benzene; 4,4'-bis(4-aminophenoxy)biphenyl; bis[4-(4-aminophenoxy)phenyl]ketone; bis[4-(4-aminophenoxy)phenyl]sulfide; bis[4-(4-aminophenoxy)phenyl]sulfoxide; bis[4-(4-aminophenoxy)phenyl]sulfone; bis[4-(3-aminophenoxy)phenyl]ether; bis[4-(4-aminophenoxy)phenyl]ether; 1,3-bis[4-(4-aminophenoxy)benzoyl]benzene; 1,3-bis[4-(3-aminophenoxy)benzoyl]benzene; 1,4-bis[4-(3-aminophenoxy)benzoyl]benzene; 4,4'-bis[(3-aminophenoxy)benzoyl]benzene; 1,1-bis[4-(3-aminophenoxy)phenyl]propane; 1,3-bis[4-(3-aminophenoxy)phenyl]propane; 3,4'-diaminodiphenylsulfide; 2,2-bis[3-(3-aminophenoxy)phenyl]-1,1,1,3,3,3-hexafluoropropane; bis[4-(3-aminophenoxy)phenyl]methane; 1,1-bis[4-(3-aminophenoxy)phenyl]ethane; 1,2-bis[4-(3-aminophenoxy)phenyl]ethane; bis[4-(3-aminophenoxy)phenyl]sulfoxide; 4,4'-bis[3-(4-aminophenoxy)benzoyl]diphenylether; 4,4'-bis[3-(3-aminophenoxy)benzoyl]diphenylether; 4,4'-bis[4-(4-amino-α,α-dimethylbenzyl)phenoxy]benzophenone; 4,4'-bis[4-(4-amino-α,α-dimethylbenzyl)phenoxy]diphenyl sulfone; bis[4-{4-(4-aminophenoxy)phenoxy}phenyl]sulfone; 1,4-bis[4-(4-aminophenoxy)phenoxy-α,α-dimethylbenzyl]benzene; 1,3-bis[4-(4-aminophenoxy)phenoxy-α,α-dimethylbenzyl]benzene; 1,3-bis[4-(4-amino-6-trifluoromethylphenoxy)-α,α-dimethylbenzyl]benzene; 1,3-bis[4-(4-amino-6-fluorophenoxy)-α,α-dimethylbenzyl]benzene; 1,3-bis[4-(4-amino-6-methylphenoxy)-α,α-dimethylbenzyl]benzene; 1,3-bis[4-(4-amino-6-cyanophenoxy)-α,α-dimethylbenzyl]benzene; 3,3'-diamino-4,4'-diphenoxybenzophenone; 4,4'-diamino-5,5'-diphenoxybenzophenone; 3,4'-diamino-4,5'-diphenoxybenzophenone; 3,3'-diamino-4-phenoxybenzophenone; 4,4'-diamino-5-phenoxybenzophenone, 3,4'-diamino-4-phenoxybenzophenone; 3,4'-diamino-5'-phenoxybenzophenone; 3,3'-diamino-4,4'-dibiphenoxybenzophenone; 4,4'-diamino-5,5'-dibiphenoxybenzophenone; 3,4'-diamino-4,5'- dibiphenoxybenzophenone; 3,3'-diamino-4-biphenoxybenzophenone; 4,4'-diamino-5-biphenoxybenzophenone; 3,4'-diamino-4-biphenoxybenzophenone; 3,4'-diamino-5'-biphenoxybenzophenone; 1,3-bis(3-amino-4-phenoxybenzoyl)benzene; 1,4-bis(3-amino-4-phenoxybenzoyl)benzene; 1,3-bis(4-amino-5-phenoxybenzoyl)benzene; 1,4-bis(4-amino-5-phenoxybenzoyl)benzene; 1,3-bis(3-amino-4-biphenoxybenzoyl)benzene, 1,4-bis(3-amino-4-biphenoxybenzoyl)benzene; 1,3-bis(4-amino-5-biphenoxybenzoyl)benzene; 1,4-bis(4-amino-5-biphenoxybenzoyl)benzene; 2,6-bis[4-(4-amino-α,α-dimethylbenzyl)phenoxy]benzonitrile; 4,4'-[9H-fluorene-9,9-diyl]bisaniline (also known as "9,9-bis(4-aminophenyl)fluorene"); spiro(xanthene-9,9'-fluorene)-2,6-diyl bis(oxycarbonyl)]bisaniline; 4,4'-[spiro(xanthene-9,9'-fluorene)-2,6-diyl bis(oxycarbonyl)]bisaniline; and 4,4'-[spiro(xanthene-9,9'-fluorene)-3,6-diyl bis(oxycarbonyl)]bisaniline. A part or all of hydrogen atoms on an aromatic ring of the above-described aromatic diamines may be substituted with halogen atoms; alkyl groups or alkoxyl groups having 1 to 3 carbon atoms; or cyano groups, and further a part or all of hydrogen atoms of the alkyl groups or alkoxyl groups having 1 to 3 carbon atoms may be substituted with halogen atoms. The aromatic diamines having a benzoxazole structure are not particularly limited, and examples thereof include: 5-amino-2-(p-aminophenyl)benzoxazole; 6-amino-2-(p-aminophenyl)benzoxazole; 5-amino-2-(m-aminophenyl)benzoxazole; 6-amino-2-(m-aminophenyl)benzoxazole; 2,2'-p-phenylenebis(5-aminobenzoxazole); 2,2'-p-phenylenebis(6-aminobenzoxazole); 1-(5-aminobenzoxazolo)-4-(6-aminobenzoxazolo)benzene; 2,6-(4,4'-diaminodiphenyl)benzo[1,2-d:5,4-d']bisoxazole; 2,6-(4,4'-diaminodiphenyl)benzo[1,2-d:4,5-d']bisoxazole; 2,6-(3,4'-diaminodiphenyl)benzo[1,2-d:5,4-d']bisoxazole; 2,6-(3,4'-diaminodiphenyl)benzo[1,2-d:4,5-d']bisoxazole; 2,6-(3,3'-diaminodiphenyl)benzo[1,2-d:5,4-d']bisoxazole; and 2,6-(3,3'-diaminodiphenyl)benzo[1,2-d:4,5-d']bisoxazole. Among these, particularly 2,2'-ditrifluoromethyl-4,4'-diaminobiphenyl, 4-amino-N-(4-aminophenyl)benzamide, 4,4'-diaminodiphenyl sulfone, and 3,3'-diaminobenzophenone are preferable. The aromatic diamines may be used singly or a plurality of these may be used in combination.

Examples of the alicyclic diamines include 1,4-diaminocyclohexane, 1,4-diamino-2-methylcyclohexane, 1,4-diamino-2-ethylcyclohexane, 1,4-diamino-2-n-propylcyclohexane, 1,4-diamino-2-isopropylcyclohexane, 1,4-diamino-2-n-butylcyclohexane, 1,4-diamino-2-isobutylcyclohexane, 1,4-diamino-2-sec-butylcyclohexane, 1,4-diamino-2-tert-butylcyclohexane, and 4,4'-methylenebis(2,6-dimethylcyclohexylamine). Among these, particularly 1,4-diaminocyclohexane and 1,4-diamino-2-methylcyclohexane are preferable, and 1,4-diaminocyclohexane is more preferable. The alicyclic diamines may be used singly or a plurality of these may be used in combination.

Examples of the diisocyanates include aromatic diisocyanates such as diphenylmethane-2,4'-diisocyanate, 3,2'- or 3,3'- or 4,2'- or 4,3'- or 5,2'- or 5,3'- or 6,2'- or 6,3'-dimethyldiphenylmethane-2,4'-diisocyanate, 3,2'- or 3,3'- or 4,2'- or 4,3'- or 5,2'- or 5,3'- or 6,2'- or 6,3'-diethyldiphenylmethane-2,4'-diisocyanate, 3,2'- or 3,3'- or 4,2'- or 4,3'- or 5,2'- or 5,3'- or 6,2'- or 6,3'-dimethoxydiphenylmethane-2,4'-diisocyanate, diphenylmethane-4,4'-diisocyanate, diphenylmethane-3,3'-diisocyanate, diphenylmethane-3,4'-diisocyanate, diphenyl ether-4,4'-diisocyanate, benzophenone-4,4'-diisocyanate, diphenylsulfone-4,4'-diisocyanate, tolylene-2,4-diisocyanate, tolylene-2,6-diisocyanate, m-xylylene diisocyanate, p-xylylene diisocyanate, naphthalene-2,6-diisocyanate, 4,4'-(2,2 bis(4-phenoxyphenyl)propane)diisocyanate, 3,3'- or 2,2'-dimethylbiphenyl-4,4'-diisocyanate, 3,3'- or 2,2'-diethylbiphenyl-4,4'-diisocyanate, 3,3'-dimethoxybiphenyl-4,4'-diisocyanate, and 3,3'-diethoxybiphenyl-4,4'-diisocyanate, and hydrogenated diisocyanates of any of these (for example, isophorone diisocyanate, 1,4-cyclohexane diisocyanate, 1,3-cyclohexane diisocyanate, 4,4'-dicyclohexylmethane diisocyanate, and hexamethylene diisocyanate). Among these, diphenylmethane-4,4'-diisocyanate, tolylene-2,4-diisocyanate, tolylene-2,6-diisocyanate, 3,3'-dimethylbiphenyl-4,4'-diisocyanate, naphthalene-2,6-diisocyanate, 4,4'-dicyclohexylmethane diisocyanate, and 1,4-cyclohexane diisocyanate are preferable from the viewpoint of low moisture absorption property, dimensional stability, price, and polymerizability. The diisocyanates may be used singly or a plurality of these may be used in combination.

In the present embodiment, the polymer film is preferably a polyimide film. When the polymer film is a polyimide film, the polymer film exhibits excellent heat resistance. When the polymer film is a polyimide film, the polymer film can be suitably cut with an ultraviolet laser.

The thickness of the polymer film is preferably 3 μm or more, more preferably 7 μm or more, still more preferably 14 μm or more, yet still more preferably 20 μm or more. The upper limit of the thickness of the polymer film is not particularly limited but is preferably 250 μm or less, more preferably 100 μm or less, still more preferably 50 μm or less for use as a flexible electronic device.

The average coefficient of linear thermal expansion (CTE) of the polymer film at between 30° C. and 250° C. is preferably 50 ppm/K or less. The CTE is more preferably 45 ppm/K or less, still more preferably 40 ppm/K or less, yet still more preferably 30 ppm/K or less, particularly preferably 20 ppm/K or less. The CTE is preferably −5 ppm/K or more, more preferably −3 ppm/K or more, still more preferably 1 ppm/K or more. When the CTE is in the above range, a small difference in coefficient of linear thermal expansion between the polymer film and a general support (inorganic substrate) can be maintained, and the polymer film and the inorganic substrate can be prevented from peeling off from each other or warping together with the support when being subjected to a process of applying heat as well. Here, CTE is a factor that indicates reversible expansion and contraction with respect to temperature. The CTE of the polymer film refers to the average value of the CTE in the application direction (MD direction) of the polymer solution or polymer precursor solution and the CTE in the transverse direction (TD direction).

In a case where the polymer film is a transparent polyimide film, the yellowness index (hereafter, also referred to as "yellow index" or "YI") of the transparent polyimide film is preferably 10 or less, more preferably 7 or less, still more preferably 5 or less, yet still more preferably 3 or less. The lower limit of the yellowness index of the transparent polyimide is not particularly limited, but is preferably 0.1 or more, more preferably 0.2 or more, still more preferably 0.3 or more for use as a flexible electronic device.

When the polymer film is a transparent polyimide film, the haze of the transparent polyimide film is preferably 1.0 or less, more preferably 0.8 or less, still more preferably 0.5 or less, yet still more preferably 0.3 or less. The lower limit of haze is not particularly limited, but industrially, there is no problem when the haze is 0.01 or more and the haze may be 0.05 or more.

The heat shrinkage rate of the polymer film at between 30° C. and 500° C. is preferably ±0.9% or less, still more preferably ±0.6 or less %. The heat shrinkage rate is a factor that represents irreversible expansion and contraction with respect to the temperature.

The tensile breaking strength of the polymer film is preferably 60 MPa or more, more preferably 80 MP or more, still more preferably 100 MPa or more. The upper limit of the tensile breaking strength is not particularly limited but is practically less than about 1000 MPa. When the tensile breaking strength is 60 MPa or more, it is possible to prevent the polymer film from breaking when being peeled off from the inorganic substrate. The tensile breaking strength of the polymer film refers to the average value of the tensile breaking strength in the machine direction (MD direction) and the tensile breaking strength in the transverse direction (TD direction) of the polymer film.

The tensile breaking elongation of the polymer film is preferably 1% or more, more preferably 5% or more, still more preferably 10% or more. When the tensile breaking elongation is 1% or more, the handleability is excellent. The tensile breaking elongation of the polymer film refers to the average value of the tensile breaking elongation in the machine direction (MD direction) and the tensile breaking elongation in the transverse direction (TD direction) of the polymer film.

The tensile modulus of elasticity of the polymer film is preferably 2.5 GPa or more, more preferably 3 GPa or more, still more preferably 4 GPa or more. When the tensile modulus of elasticity is 2.5 GPa or more, the polymer film is less expanded and deformed when being peeled off from the inorganic substrate and exhibits excellent handleability. The tensile modulus of elasticity is preferably 20 GPa or less, more preferably 15 GPa or less, still more preferably 12 GPa or less. When the tensile modulus of elasticity is 20 GPa or less, the polymer film can be used as a flexible film. The tensile modulus of elasticity of the polymer film refers to the average value of the tensile modulus of elasticity in the machine direction (MD direction) and the tensile modulus of elasticity in the transverse direction (TD direction) of the polymer film.

Unevenness of the thickness of the polymer film is preferably 20% or less, more preferably 12% or less, still more preferably 7% or less, particularly preferably 4% or less. When the unevenness of the thickness exceeds 20%, the polymer film tends to be hardly adopted to a narrow portion. Incidentally, unevenness of the thickness of a film can be determined based on the following equation from film thicknesses, which are measured at about 10 randomly extracted positions of a film to be measured by using, for example, a contact-type film thickness meter.

Unevenness of thickness of film (%)=100×(maximum film thickness−minimum film thickness)÷average film thickness The polymer film is preferably obtained in the form of being wound as a long polymer film having a width of 300 mm or more and a length of 10 m or more at the time of production, more preferably in the form of a roll-shaped polymer film wound around a winding core. When the polymer film is wound in a roll shape, it is easy to transport the polymer film in the form of a polymer film wound in a roll shape.

In order to secure handleability and productivity of the polymer film, a lubricant (particles) having a particle size of about 10 to 1000 nm is preferably added to/contained in the polymer film at about 0.03 to 3% by mass to impart fine unevenness to the surface of the polymer film and secure slipperiness.

<Inorganic Substrate>

The inorganic substrate may be a plate-type substrate which can be used as a substrate made of an inorganic substance, and examples thereof include those mainly composed of glass plates, ceramic plates, semiconductor wafers, metals and the like and those in which these glass plates, ceramic plates, semiconductor wafers, and metals are laminated, those in which these are dispersed, and those in which fibers of these are contained as the composite of these.

Examples of the glass plates include quartz glass, high silicate glass (96% silica), soda lime glass, lead glass, aluminoborosilicate glass, and borosilicate glass (Pyrex (registered trademark)), borosilicate glass (alkali-free), borosilicate glass (microsheet), aluminosilicate glass and the like. Among these, those having a coefficient of linear thermal expansion of 5 ppm/K or less are desirable, and in the case of a commercially available product, "Corning (registered trademark) 7059", "Corning (registered trademark) 1737", and "EAGLE" manufactured by Corning Inc., "AN100" manufactured by AGC Inc., "OA10" and "OA11G" manufactured by Nippon Electric Glass Co., Ltd., "AF32" manufactured by SCHOTT AG, and the like that are glass for liquid crystal are desirable.

The semiconductor wafer is not particularly limited, but examples thereof include a silicon wafer and wafers of germanium, silicon-germanium, gallium-arsenide, aluminum-gallium-indium, nitrogen-phosphorus-arsenic-antimony, SiC, InP (indium phosphide), InGaAs, GaInNAs, LT, LN, ZnO (zinc oxide), CdTe (cadmium telluride), ZnSe (zinc selenide) and the like. Among these, the wafer preferably used is a silicon wafer, and a mirror-polished silicon wafer having a size of 8 inches or more is particularly preferable.

The metals include single element metals such as W, Mo, Pt, Fe, Ni, and Au, alloys such as Inconel, Monel, Nimonic, carbon-copper, Fe—Ni-based Invar alloy, and Super Invar alloy, and the like. Multilayer metal plates formed by adding another metal layer or a ceramic layer to these metals are also included. In this case, when the overall coefficient of linear thermal expansion (CTE) with the additional layer is low, Cu, Al and the like are also used in the main metal layer. The metals used as the addition metal layer is not limited as long as they are those that strengthen the close contact property with the polyamic acid heat-cured product and those that have properties that diffusion does not occur and the chemical resistance and heat resistance are favorable, but suitable examples thereof include Cr, Ni, TiN, and Mo-containing Cu.

Examples of the ceramic plate in the present invention include ceramics for base such as $Al_2O_3$, mullite, ALN, SiC, crystallized glass, cordierite, spodumene, Pb—BSG+Ca-$ZrO_3+Al_2O_3$, crystallized glass+$Al_2O_3$, crystallized Ca—BSG, BSG+quartz, BSG+$Al_2O_3$, Pb—BSG+$Al_2O_3$, glass-ceramic, and zerodur material.

The thickness of the inorganic substrate is not particularly limited, but a thickness of 10 mm or less is preferable, a thickness of 3 mm or less is more preferable, and a thickness of 1.3 mm or less is still more preferable from the viewpoint of handleability. The lower limit of the thickness is not particularly limited but is preferably 0.07 mm or more, more preferably 0.15 mm or more, and further preferably 0.3 mm or more. When the inorganic substrate is too thin, the inorganic substrate is easily destroyed and it is difficult to handle the inorganic substrate. When the inorganic substrate is too thick, the inorganic substrate is heavy and it is difficult to handle the inorganic substrate.

Surface treatment may be performed for the purpose of improving the wettability and adhesive property of the inorganic substrate. As the surface treatment agent to be used, coupling agents such as a silane coupling agent, an aluminum-based coupling agent, and a titanate meter coupling agent can be used. In particular, excellent properties can be obtained when a silane coupling agent is used.

<Silane Coupling Agent (SCA)>

The laminate preferably has a silane coupling agent layer (also referred to as a silane coupling agent condensed layer) between the polymer film layer and the inorganic substrate. In the present invention, the silane coupling agent refers to a compound containing a Si (silicon) component at 10% by mass or more. By using the silane coupling agent layer, the intermediate layer between the polyamic acid heat-cured product layer and the inorganic substrate can be thinned, and thus there are effects that the amounts of degassed components during heating are small, elution hardly occurs in the wet process as well, and only trace amounts of components are eluted even if elution occurs. The silane coupling agent preferably contains a large amount of silicon oxide component since the heat resistance is improved, and is particularly preferably one exhibiting heat resistance at a temperature of about 400° C. The thickness of the silane coupling agent layer is preferably 200 nm or less (0.2 µm or less). As a range for use as a flexible electronic device, the thickness of the silane coupling agent layer is preferably 100 nm or less (0.1 µm or less), more desirably 50 nm or less, still more desirably 10 nm. When a silane coupling agent layer is normally fabricated, the thickness thereof is about 0.10 µm or less. In processes where it is desired to use as little silane coupling agent as possible, a silane coupling agent layer having a thickness of 5 nm or less can also be used. Since the peel strength may decrease or there may be some parts that are not attached when the thickness is less than 0.1 nm, and the thickness is preferably 0.1 nm or more, more preferably 0.5 nm or more.

The silane coupling agent in the present invention is not particularly limited, but one having an amino group or an epoxy group is preferable. When heat resistance is required in the process, a silane coupling agent, in which Si and an amino group or the like is linked to each other via an aromatic, is desirable.

The silane coupling agent is not particularly limited, but preferably contains a coupling agent having an amino group. Specific examples thereof include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, aminophenyltrimethoxysilane, aminophenethyltrimethoxysilane, and aminophenylaminomethylphenethyltrimethoxysilane.

<Protective Film>

The laminate of the present invention includes a protective film laminated on (bonded) to the heat-resistant polymer film. The protective film laminated on (bonded) to the heat-resistant polymer film is usually a film for temporarily protecting the surface of the heat-resistant polymer film, and is not particularly limited as long as it is a peelable film that can protect the surface of the heat-resistant polymer film. In the present invention, it is preferable to select a protective film so that Formula (1) is satisfied in consideration of ease of peeling off in a post-process. For example, heat-resistant super engineering plastic films such as a PPS film, a PEEK film, an aromatic polyamide film, a polyimide film, and a polyimide benzasol film in addition to a PET film, a PEN film, a polyethylene film, a polypropylene film, a nylon film, and the like can be used. Among these, a PET film is preferable.

In the laminate of the present invention, it is preferable that the arithmetic mean waviness Wa of the protective film surface in contact with the heat-resistant polymer film is 30 nm or less. The arithmetic mean waviness Wa is a parameter representing the magnitude (amplitude) of waviness in the height direction. Since the waviness involved in the close contact property with the heat-resistant polymer film consist of waviness with a period of several tens of µm, the range of the measurement region by an interference microscope is preferably 60 µm or more in both the x and y directions.

In the present invention, the heat-resistant polymer film has an extremely smooth surface since it is assumed that a device will be formed on the surface. When the arithmetic mean waviness Wa of the protective film surface in contact with the heat-resistant polymer film is 30 nm or less, the close contact property with the heat-resistant polymer film can be sufficiently secured. Therefore, in the present invention, the arithmetic mean waviness Wa of the protective film is preferably 29 nm or less, more preferably 28 nm or less, still more preferably 27 nm or less. The lower limit of the arithmetic mean waviness Wa of the protective film is not particularly limited, but is usually 5 nm or more.

The arithmetic mean waviness Wa of the protective film may be controlled by the manufacturing conditions (temperature, linear velocity, nip roll surface waviness, nip pressure, and the like) during molding of the protective film. For example, the arithmetic mean waviness Wa tends to decrease when the molding temperature is lowered, and the arithmetic mean waviness Wa tends to decrease by increasing the linear velocity or decreasing the nip pressure as well. The arithmetic mean waviness Wa can also be controlled by the storage conditions (temperature, humidity, storage time) of the protective film after being molded. In a case of using a commercially available protective film, it is also possible to select a suitable one by measuring the arithmetic mean waviness Wa of the used protective film before being bonded to the transparent resin film.

The protective film preferably has a pressure sensitive adhesive layer on the surface in contact with the heat-resistant polymer film layer. By having a pressure sensitive adhesive layer on the protective film, self-adsorptive properties can be exerted. The pressure sensitive adhesive layer is not particularly limited, but for example, urethane-based, silicone-based, and acrylic-based pressure sensitive adhesive layers can be used. The pressure sensitive adhesive layer can be fabricated by applying a pressure sensitive adhesive dissolved in a solvent and drying the pressure sensitive adhesive.

From the viewpoint of being able to reduce the cost, resin films (protective films) exhibiting self-adhesive properties of polyolefin-based resins and the like may be used. Specifically, polyolefin-based resin films are preferable. Polypropylene-based resin films or polyethylene-based resin films are more preferable and polyethylene-based resin films are still more preferable since these are easily available and inexpensive. Examples of polyethylene-based resins include high pressure processed low density polyethylene (LDPE), linear short chain branched polyethylene (LLDPE), medium-low pressure processed high density polyethylene (HDPE), and very low density polyethylene (VLDPE). LLDPE is preferable as the resin for the surface adjacent to the heat-resistant polymer film from the viewpoints of adhesive properties with the heat-resistant polymer film and workability.

The protective film may contain various additives in the base material layer or pressure sensitive adhesive layer if necessary. Examples of the additives include fillers, antioxidants, light stabilizers, anti-gelling agents, organic wetting agents, antistatic agents, surfactants, pigments, and dyes. However, it is preferable that the additives are contained in a range in which the protective film satisfies the following numerical range in ultraviolet transmittance measurement. In a case where the protective film includes a base material and a pressure sensitive adhesive layer, the base material preferably does not contain an ultraviolet absorber. Examples of the ultraviolet absorber include those described later.

The 50% cutoff wavelength of ultraviolet transmittance of the protective film is preferably 240 nm or more, more preferably 270 nm or more, still more preferably 300 nm or more, particularly preferably 340 nm or more in the ultraviolet transmittance measurement (UV transmittance measurement). When the 50% cutoff wavelength of ultraviolet transmittance of the protective film is 240 nm or more, the protective film and the heat-resistant polymer film can be more suitably cut with an ultraviolet laser. Hence, the heat-resistant polymer film can be cut into an arbitrary size with a laser from the state of an inorganic substrate/heat-resistant polymer film/protective film laminate, or the heat-resistant polymer film with protective film can be cut into an arbitrary size with a laser. The upper limit is preferably 380 nm or less, which is the general wavelength region of ultraviolet rays.

The protective film preferably contains an ultraviolet absorber to achieve the ultraviolet transmittance. Examples of the ultraviolet absorber include organic ultraviolet absorbers.

Examples of the organic ultraviolet absorbers include benzotriazole-based, benzophenone-based, and cyclic iminoester-based ultraviolet absorbers, and combinations thereof. Among these, benzotriazole-based and cyclic iminoester-based ultraviolet absorbers are particularly preferable from the viewpoint of durability.

Examples of the benzotriazole-based ultraviolet absorbers include 2-[2'-hydroxy-5'-(methacryloyloxymethyl)phenyl]-2H-benzotriazole, 2-[2'-hydroxy-5'-(methacryloyloxyethyl)phenyl]-2H-benzotriazole, 2-[2'-hydroxy-5'-(methacryloyloxypropyl)phenyl]-2H-benzotriazole, 2-[2'-hydroxy-5'-(methacryloyloxyhexyl)phenyl]-2H-benzotriazole, 2-[2'-hydroxy-3'-tert-butyl-5'-(methacryloyloxyethyl)phenyl]-2H-benzotriazole, 2-[2'-hydroxy-5'-tert-butyl-3'-(methacryloyloxyethyl)phenyl]-2H-benzotriazole, 2-[2'-hydroxy-5'-(methacryloyloxyethyl)phenyl]-5-chloro-2H-benzotriazole, 2-[2'-hydroxy-5'-(methacryloyloxyethyl)phenyl]-5-methoxy-2H-benzotriazole, 2-[2'-hydroxy-5'-(methacryloyloxyethyl)phenyl]-5-cyano-2H-benzotriazole, 2-[2'-hydroxy-5'-(methacryloyloxyethyl)phenyl]-5-tert-butyl-2H-benzotriazole, and 2-[2'-hydroxy-5'-(methacryloyloxyethylphenyl]-5-nitro-2H-benzotriazole.

Examples of the benzophenone-based ultraviolet absorbers include 2,2',4,4'-tetrahydroxybenzophenone, 2,2'-dihydroxy-4,4'-dimethoxybenzophenone, 2,2'-dihydroxy-4-methoxybenzophenone, 2,4-dihydroxybenzophenone, 2-hydroxy-4-acetoxyethoxybenzophenone, 2-hydroxy-4-methoxybenzophenone, 2,2'-dihydroxy-4-methoxybenzophenone, 2,2'-dihydroxy-4,4'-dimethoxybenzophenone, 2-hydroxy-4-n-octoxybenzophenone, and 2,2'-dihydroxy-4,4'-dimethoxy-5,5'-disulfobenzophenone disodium salt.

Examples of the cyclic iminoester-based ultraviolet absorbers include 2,2'-(1,4-phenylene)bis(4H-3,1-benzoxazin-4-one), 2-methyl-3,1-benzoxazin-4-one, 2-butyl-3,1-benzoxazin-4-one, 2-phenyl-3,1-benzoxazin-4-one, 2-(1- or 2-naphthyl)-3,1-benzoxazin-4-one, 2-(4-biphenyl)-3,1-benzoxazin-4-one, 2-p-nitrophenyl-3,1-benzoxazin-4-one, 2-m-nitrophenyl-3,1-benzoxazine-4-one, 2-p-benzoylphenyl-3,1-benzoxazin-4-one, 2-p-methoxyphenyl-3,1-benzoxazin-4-one, 2-o-methoxyphenyl-3,1-benzoxazin-4-one, 2-cyclohexyl-3,1-benzoxazin-4-one, 2-p-(or m-)phthalimidophenyl-3,1-benzoxazin-4-one, 2,2'-(1,4-phenylene)bis(4H-3,1-benzoxazinone-4-one) 2,2'-bis(3,1-benzoxazin-4-one), 2,2'-ethylenebis(3,1-benzoxazin-4-one), 2,2'-tetramethylenebis(3,1-benzoxazin-4-one), 2,2'-decamethylenebis(3,1-benzoxazin-4-one), 2,2'-p-phenylenebis(3,1-benzoxazin-4-one), 2,2'-m-phenylenebis(3,1-benzoxazin-4-one), 2,2'-(4,4'-diphenylene)bis(3,1-benzoxazin-4-one), 2,2'-(2,6- or 1,5-naphthalene)bis(3,1-benzoxazin-4-one), 2,2'-(2-methyl-p-phenylene)bis(3,1-benzoxazin-4-one), 2,2'-(2-nitro-p-phenylene)bis(3,1-benzoxazin-4-one), 2,2'-(2-chloro-p-phenylene)bis(3,1-benzoxazine)-4-one), 2,2'-(1,4-cyclohexylene)bis(3,1-benzoxazin-4-one), and 1,3,5-tri(3,1-benzoxazin-4-one-2-yl)benzene.

In addition, 1,3,5-tri(3,1-benzoxazin-4-one-2-yl)naphthalene and 2,4,6-tri(3,1-benzoxazin-4-one-2-yl)naphthalene, 2,8-dimethyl-4H,6H-benzo(1,2-d;5,4-d')bis-(1,3)-oxazine-4,6-dione, 2,7-dimethyl-4H,9H-benzo(1,2-d;5,4-d')bis-(1,3)-oxazine-4,9-dione, 2,8-diphenyl-4H,8H-benzo(1,2-d;5,4-d')bis-(1,3)-oxazine-4,6-dione, 2,7-diphenyl-4H,9H-benzo(1,2-d;5,4-d')bis-(1,3)-oxazine-4,6-dione, 6,6'-bis(2-methyl-4H,3,1-benzoxazin-4-one), 6,6'-bis(2-ethyl-4H,3,1-benzoxazin-4-one), 6,6'-bis(2-phenyl-4H,3,1-benzoxazin-4-one), 6,6'-methylenebis(2-methyl-4H,3,1-benzoxazin-4-one), 6,6'-methylenebis(2-phenyl-4H,3,1-benzoxazin-4-one), 6,6'-ethylenebis(2-methyl-4H,3,1-benzoxazin-4-one), 6,6'-ethylenebis(2-phenyl-4H,3,1-benzoxazin-4-one), 6,6'-butylenebis(2-methyl-4H,3,1-benzoxazin-4-one), 6,6'-butylenebis(2-phenyl-4H,3,1-benzoxazin-4-one), 6,6'-oxybis(2-methyl-4H,3,1-benzoxazin-4-one), 6,6'-oxybis(2-phenyl-4H,3,1-benzoxazin-4-one), 6,6'-sulfonylbis(2-methyl-4H,3,1-benzoxazin-4-one), 6,6'-sulfonylbis(2-phenyl-4H,3,1-benzoxazin-4-one), 6,6'-carbonylbis(2-methyl-4H,3,1-benzoxazin-4-one), 6,6'-carbonylbis(2-phenyl-4H,3,1-benzoxazin-4-one), 7,7'-methylenebis(2-methyl-4H,3,1-benzoxazin-4-one), 7,7'-methylenebis(2-phenyl-4H,3,1-benzoxazin-4-one), 7,7'-bis(2-methyl-4H,3,1-benzoxazin-4-one), 7,7'-ethylenebis(2-methyl-4H,3,1-benzoxazin-4-one), 7,7'-oxybis(2-methyl-4H,3,1-benzoxazin-4-one), 7,7'-sulfonylbis(2-methyl-4H,3,1-benzoxazin-4-one), 7,7'-carbonylbis(2-methyl-4H,3,1-benzoxazin-4-one), 6,7'-bis(2-methyl-4H,3,1-benzoxazin-4-one), 6,7'-bis(2-phenyl-4H,3,1-benzoxazin-4-one), 6,7'-methylenebis(2-methyl-4H,3,1-benzoxazin-4-one), 6,7'-methylenebis(2-phenyl-4H,3,1-benzoxazin-4-one) and the like can also be used as cyclic iminoester-based ultraviolet absorbers.

<Peeling Auxiliary Tape>

In the present invention, in the laminate, an inorganic substrate, a heat-resistant polymer film, a protective film, and a protective film peeling auxiliary tape are laminated in this order. The protective film peeling auxiliary tape (hereinafter also referred to simply as peeling auxiliary tape) is for assisting peeling off of the protective film from the heat-resistant polymer film, and basically includes a base material and a pressure sensitive adhesive layer provided on the surface of the base material, but resin films exhibiting self-adsorptive properties of polyolefin-based resins and the like may be used in a case where the peel strength satisfies the relation of Formula (1).

As the base material of the peeling auxiliary tape, for example, heat-resistant super engineering plastic films such as a PPS film, a PEEK film, an aromatic polyamide film, a polyimide film, and a polyimide benzasol film in addition to a PET film, a PEN film, a polyethylene film, a polypropylene film, a nylon film, and the like can be used.

The pressure sensitive adhesive layer of the peeling auxiliary tape is not particularly limited as long as the relation of Formula (1) is satisfied, but for example, urethane-based, silicone-based, and acrylic-based pressure sensitive adhesive layers can be used. The pressure sensitive adhesive layer can be fabricated by applying a pressure sensitive adhesive dissolved in a solvent and drying the pressure sensitive adhesive. As commercially available pressure sensitive adhesive tapes, for example, Cellulose Tape (registered trademark) and Film Cloth Tape manufactured by NICHIBAN Co., Ltd., Cloth Pressure Sensitive Adhesive Tape and Vinyl Tape manufactured by Nitto Denko Corporation, and the like can be used.

In a case where the peeling auxiliary tape includes a base material and a pressure sensitive adhesive layer, the thickness of the base material is preferably 30 µm or more, still more preferably 50 µm or more. When the thickness of the base material is 30 µm or more, the handleability is favorable. Since it is easier to handle the peeling auxiliary tape when being wound in a roll shape, the upper limit of the thickness is preferably 400 µm or less, more preferably 200 µm or less. The same applies to the preferable thickness in a case where the peeling auxiliary tape includes a self-adsorptive film.

In a case where the peeling auxiliary tape includes a base material and a pressure sensitive adhesive layer, the thickness of the pressure sensitive adhesive layer is preferably 7 µm or more, still more preferably 10 µm or more. When the thickness of the pressure sensitive adhesive layer is 7 µm or more, it is easy to secure the adhesive force with the protective film. The thickness of the pressure sensitive adhesive layer is preferably 20 µm or less. When the pressure sensitive adhesive layer has a thickness of 20 µm, the pressure sensitive adhesive layer does not protrude from the base material by the pressure when pasted to the protective film, and the laminate is less likely to become dirty.

The area B2 of the peeling auxiliary tape is preferably smaller than the area B1 of the protective film (B1>B2). In a case where the area B1 and the area B2 are equal (B1=B2) as well, the protective film can be peeled off as long as the relation of Formula (1) is satisfied, but the effect may be minor when B1=B2 since the main effect of the protective film peeling auxiliary tape is to lift the peeling edge of the protective film. In a case where the area B1 is smaller than the area B2 (B1<B2) as well, the protective film can be peeled off, but there is a risk that the laminate is contaminated with a transferred material from the pressure sensitive adhesive since the pressure sensitive adhesive layer of the peeling auxiliary tape also comes into contact with places other than the protective film, for example, the inorganic substrate.

As illustrated in FIG. 1, the peeling auxiliary tape is pasted to the protective film edge of the heat-resistant polymer film with protective film/inorganic substrate laminate (inorganic substrate/heat-resistant polymer film/protective film). The side to be pasted may be one side as illustrated in FIGS. 1(a) to 1(d), but the peeling auxiliary tape may be pasted to two or more edges and the protective film may be peeled off from two or more peeling edges as illustrated in FIG. 1(e).

In a case where the peeling auxiliary tape is pasted so as to be partially protrudes from the protective film as illustrated in FIG. 1, it is preferable that the pressure sensitive adhesive layer is not exposed at the portion that is not in contact with the protective film. When the pressure sensitive adhesive layer is exposed, there is a risk that the laminate is contaminated with a transferred material from the pressure sensitive adhesive since the pressure sensitive adhesive layer of the peeling auxiliary tape also comes into contact with places other than the protective film, for example, the inorganic substrate. Examples of the method for partially exposing the pressure sensitive adhesive layer include a method in which a pressure sensitive adhesive layer is formed only on the width to be pasted to the protective film of the base material of the peeling auxiliary tape and a method in which a non-pressure sensitive adhesive film is pasted to the portion protruding from the protective film.

<Laminate>

The laminate of the present invention includes the inorganic substrate, the heat-resistant polymer film, the protective film, and the protective film peeling auxiliary tape in this order, and the adhesive strength F1 (hereinafter also simply referred to as F1) between the inorganic substrate and the heat-resistant polymer film by a 90-degree peeling method, the adhesive strength F2 (hereinafter also simply referred to as F2) between the heat-resistant polymer film and the protective film by a 90-degree peeling method, and the adhesive strength F3 (hereinafter also simply referred to as F3) between the protective film and the protective film peeling auxiliary tape by a 90-degree peeling method are required to satisfy the relation of the following Formula (1).

$$F3>F1>F2 \quad (1)$$

As Formula (1) is satisfied, only the protective film can be easily peeled off without peeling off the inorganic substrate and the polymer film in both cases of manual peeling and mechanical peeling.

In the laminate of the present invention, when the peel strength F2 between the heat-resistant polymer film and the protective film is equal to or greater than the peel strength F1 between the inorganic substrate and the heat-resistant polymer film, it is difficult to peel off only the protective film in some cases. Particularly, in a case where the peel strength F1 between the inorganic substrate and the heat-resistant polymer film is low, the inorganic substrate and the polymer film may be easily peeled off when the protective film edge is lifted. It is not a major problem that the size of the laminate is small since it is possible to manually create the peeling edge using the peeling tape or to peel off only the protective film edge with a jig such as tweezers, but the maximum size of the laminate of an inorganic substrate and a polymer film is about 2×3 m assuming that the laminate will be handled by display manufacturing equipment. For laminates of this size, it is assumed that peeling off of the protective film will be performed by a machine, and it is difficult to peel off only the protective film without peeling off the inorganic substrate and the protective film by delicately adjusting the force as in the case of manual peeling.

By adopting the configuration of the present invention, such problems can be avoided, and only the protective film can be peeled off without peeling off the inorganic substrate and the polymer film in both cases of manual peeling and mechanical peeling in the laminate of the present invention.

As used herein, F1 and F2 are 90° peel strength values after the laminate (hereinafter, also referred to as laminate precursor.) in which an inorganic substrate, a heat-resistant polymer film, and a protective film are laminated in this order has been subjected to heat treatment at 120° C. for 10 minutes in an air atmosphere (hereinafter, also simply referred to as heat treatment). In other words, the laminate precursor is a laminate before lamination (pasting) of the peeling auxiliary tape. The lamination (pasting) of the peeling auxiliary tape may be performed before or after the laminate precursor is subjected to heat treatment, but since it is preferable to laminate (paste) the peeling auxiliary tape after the laminate precursor has been subjected to heat treatment, F3 is the value of 90° peel strength in a state where the heat treatment is not yet performed.

The F1 is not particularly limited as long as it is a value satisfying Formula (1), but is preferably 0.05 N/cm or more, more preferably 0.08 N/cm or more, still more preferably 0.1 N/cm or more. The F1 is preferably 0.3 N/cm or less, more preferably 0.28 N/cm or less. When F1 is 0.05 N/cm or more, it is possible to prevent the heat-resistant polymer film from peeling off from the inorganic substrate before and during device formation. When F1 is 0.3 N/cm or less, the inorganic substrate and the heat-resistant polymer film are easily peeled off from each other after device formation. In other words, when F1 is 0.3 N/cm or less, the inorganic substrate and the heat-resistant polymer film are easily peeled off from each other even if the peel strength between the inorganic substrate and the heat-resistant polymer film is slightly increased during device formation.

The F2 is not particularly limited as long as it is a value satisfying Formula (1), but is preferably 0.001 N/cm or more, more preferably 0.002 N/cm or more, still more preferably 0.005 N/cm or more. The F2 is preferably 0.1 N/cm or less, more preferably 0.08 N/cm or less. When F2 is 0.1 N/cm or less, the protective film can be suitably peeled off when a heat-resistant polymer film is used. When F2 is 0.001 N/cm or more, at the stage before the heat-resistant polymer film is used (for example, during transportation), unintentional peeling off of the protective film from the heat-resistant polymer film can be suppressed.

In the present invention, it is preferable that the change rate of F2 after the heat treatment (heat treatment at 120° C. for 10 minutes) is 50% or less. The change rate is more preferably 40% or less, still more preferably 30% or less since the heat-resistant polymer film is less likely to undergo contamination due to peeling off of the protective film or changes (degradation) of the pressure sensitive adhesive of the protective film by heat during the laminate manufacturing process. The lower limit of the change rate is not particularly limited, but is preferably −20% or more, more preferably −10% or more, still more preferably −5% or more. The change rate of F2 can be determined by the following equation.

Change rate of $F2(\%) = (F2$ after heat treatment $- F2$ before heat treatment$)/F2$ before heat treatment$\times 100$ F2 preferably satisfies the relation of F1>F2 before the heat treatment (heating at 120° C. for 10 minutes) as well. As the relation is satisfied, only the protective film can be easily peeled off without peeling off the inorganic substrate and the polymer film in a case where the step of heating the laminate is omitted as well.

The F3 is not particularly limited as long as it is a value satisfying Formula (1), but is preferably 0.1 N/cm or more, more preferably 0.15 N/cm or more, still more preferably 0.18 N/cm or more. The upper limit thereof is not particularly specified, but is preferably 15 N/cm or less, more preferably 13 N/cm or less. As F3 is within the above range, the protective film can be suitably peeled off without peeling off the inorganic substrate and the heat-resistant polymer film.

The ratio (F1/F2) of the F1 to the F2 is required to be more than 1, and is preferably 2 or more, more preferably 5 or more, still more preferably 10 or more. The ratio (F1/F2) is preferably 100 or less, more preferably 80 or less, still more preferably 60 or less.

The ratio (F3/F1) of the F3 to the F1 is required to be more than 1, and is preferably 1.1 or more, more preferably 1.3 or more, still more preferably 1.4 or more. The ratio (F3/F1) is preferably 5 or less, more preferably 4 or less, still more preferably 3 or less.

<Method for Manufacturing Laminate>

Figure 2:
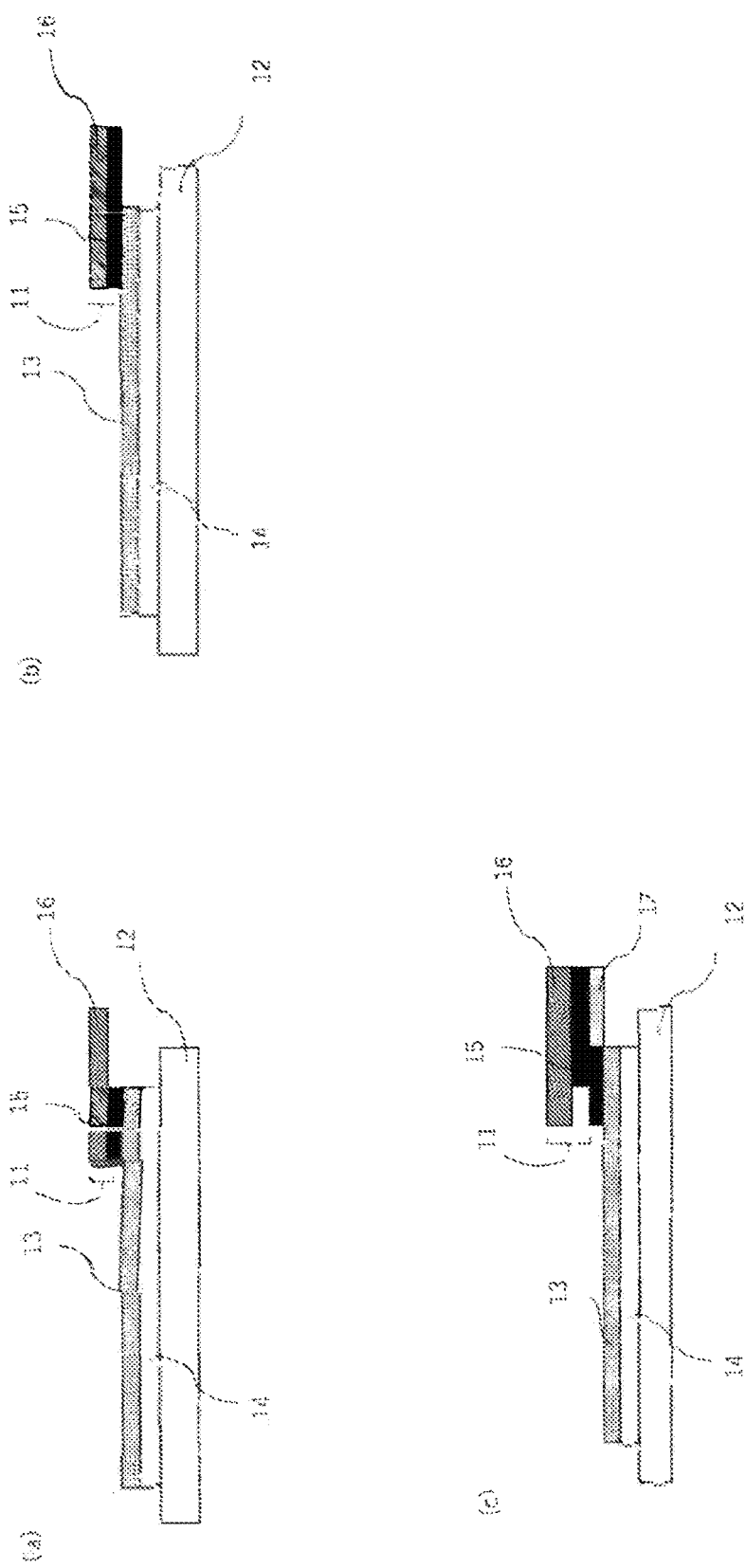
FIGS. 2(a), 2(b), and 2(c) are schematic cross-sectional diagrams of a laminate (inorganic substrate/heat-resistant polymer film/protective film/protective film peeling auxiliary tape) according to the present invention.

FIG. 2 is cross-sectional diagrams schematically illustrating a laminate according to the present embodiment. FIG. 2(a) is an example in which a pressure sensitive adhesive layer 15 of a protective film peeling auxiliary tape is laminated on a part of a base material 16 of the protective film peeling auxiliary tape (the pressure sensitive adhesive layer 15 exists only at the overlapping portion of the base material 16 and protective film 13), and FIG. 2(b) is an example in which the pressure sensitive adhesive layer 15 of the protective film peeling auxiliary tape is laminated on the entire base material 16 of the protective film peeling auxiliary tape. FIG. 2(c) is an example in which the pressure sensitive adhesive layer 15 of the protective film peeling auxiliary tape is laminated on the front part of the base material 16 of the protective film peeling auxiliary tape and a pressure sensitive layer coating film 17 of the protective film peeling auxiliary tape is pasted to the portion other than the portion overlapping the protective film 13.

As illustrated in FIG. 2, the laminate according to the present embodiment includes a protective film peeling auxiliary tape 11, the protective film 13, a heat-resistant polymer film 14, and an inorganic substrate 12, and the inorganic substrate 12 and the heat-resistant polymer film 14 are laminated to be in contact with each other, or laminated with only a silane coupling agent layer (not illustrated) interposed therebetween. The protective film peeling auxiliary tape 11 includes the pressure sensitive adhesive layer 15 of the protective film peeling auxiliary tape and the base material 16 of the protective film peeling auxiliary tape.

The laminate of the present embodiment can be fabricated, for example, according to the following procedure.

First, a heat-resistant polymer plastic film with protective film and an inorganic substrate are prepared. In a case of using a heat-resistant polymer film with protective film in which protective films are provided on both surfaces of the heat-resistant polymer film, a heat-resistant polymer film with single-sided protective film can be obtained by peeling off the protective film provided on the surface to be pasted to the inorganic substrate of the heat-resistant polymer film with protective film. In a case where the laminate is provided with a silane coupling agent layer, at least one surface of the inorganic substrate is treated with a silane coupling agent in advance.

Next, one surface (the surface treated with a silane coupling agent in a case were a silane coupling agent layer is provided) of the inorganic substrate is superimposed on the heat-resistant polymer film with protective film, and the two are pressurized and heated, whereby a heat-resistant polymer film with protective film/inorganic substrate laminate (laminate precursor) can be obtained. Incidentally, the surface on the side not provided with the protective film of the heat-resistant polymer film is treated with a silane coupling agent in advance, the surface treated with a silane coupling agent is superimposed on the inorganic substrate, and the two are pressurized and heated for lamination, whereby a heat-resistant polymer film with protective film/inorganic substrate laminate (laminate precursor) can also be obtained. By pasting a protective film peeling auxiliary tape to the protective film surface of the obtained heat-resistant polymer film with protective film/inorganic substrate (laminate precursor), a heat-resistant polymer film with protective film/inorganic substrate (laminate) pasted with a peeling auxiliary tape can be obtained.

As the silane coupling agent treatment method, known methods such as spin coating, spray coating, and dip coating can be used, and the treatment can also be performed by depositing silane coupling agent vapor generated by heating a silane coupling agent on the inorganic substrate (vapor deposition method).

Figure 3:
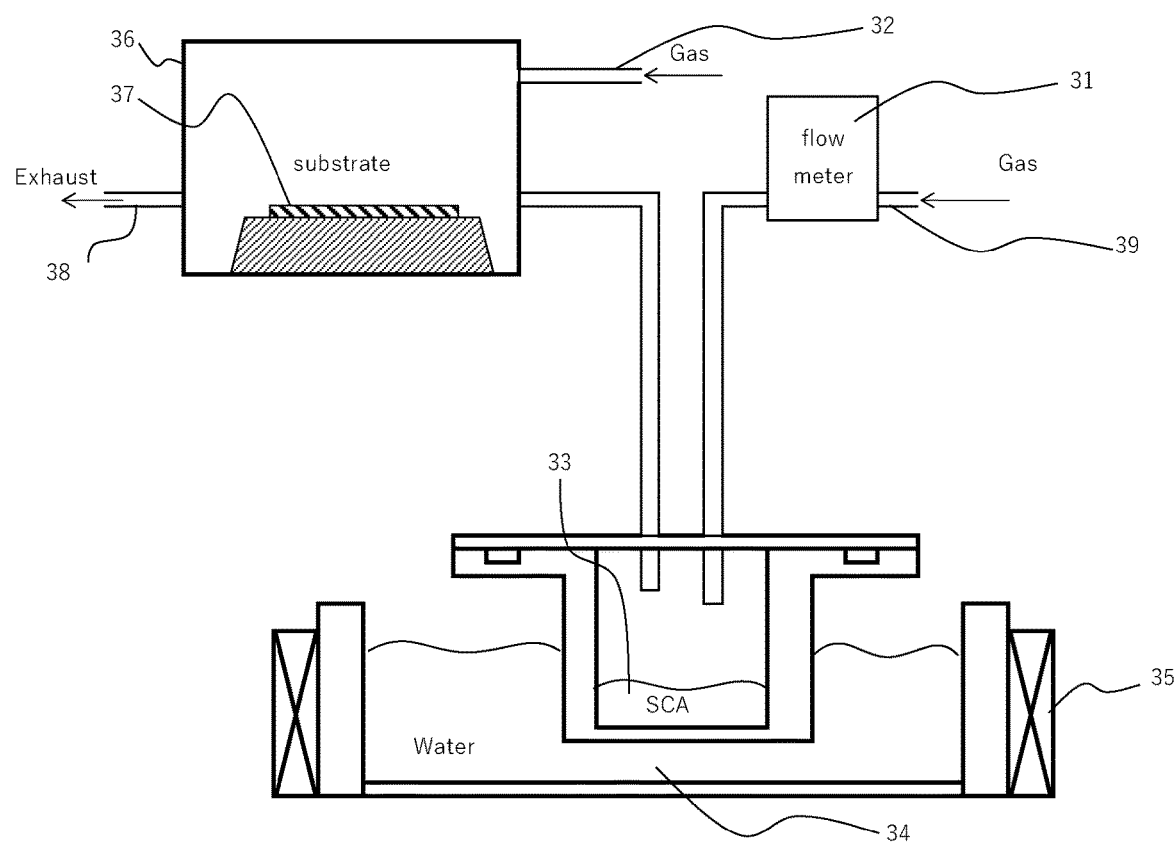
FIG. 3 is a diagram schematically illustrating an example of a silane coupling agent treatment apparatus used in a vapor deposition method according to the present invention.

FIG. 3 is a diagram schematically illustrating an example of a silane coupling agent treatment apparatus used in a vapor deposition method.

As illustrated in FIG. 3, the silane coupling agent treatment apparatus includes a processing chamber (chamber) 36 connected to a gas inlet 32, an exhaust port 38, and a chemical tank (silane coupling agent tank) 33. A silane coupling agent is filled in the chemical tank (silane coupling agent tank) 33, and the temperature of the chemical tank 33 is controlled by a hot water tank (water bath) 34 equipped with a heater 35. A gas inlet 39 is connected to the chemical tank (silane coupling agent tank) 33 so that gas can be introduced into the chemical tank 33 from the outside. The flow rate of gas is adjusted by a flow meter 31 connected to the gas inlet 39. When gas is introduced through the gas inlet 39, the vaporized silane coupling agent in the chemical tank 33 is pushed into the processing chamber 36, and attached onto a substrate 37 (inorganic substrate or heat-resistant polymer film) disposed in the processing chamber 36 as a silane coupling agent layer.

Examples of the pressurization method include normal pressing or lamination in the air or pressing or lamination in a vacuum. Lamination in the air is desirable in the case of a laminate having a large size (for example, more than 200 mm) in order to acquire stable peel strength over the entire surface. In contrast, pressing in a vacuum is preferable in the case of a laminate having a small size of about 200 mm or less. As the degree of vacuum, a degree of vacuum obtained by an ordinary oil-sealed rotary pump is sufficient, and about 10 Torr or less is sufficient. The pressure is preferably 1 MPa to 20 MPa, still more preferably 3 MPa to 10 MPa. The substrate may be destroyed when the pressure is high, and close contact may not be achieved at some portions when the pressure is low. The temperature is preferably 90° C. to 300° C., still more preferably 100° C. to 250° C. The heat-resistant polymer film may be damaged when the temperature is high, and close contact force may be weak when the temperature is low.

The shape of the laminate is not particularly limited and may be square or rectangular. The shape of the laminate is preferably rectangular, and the length of the long side is preferably 300 mm or more, more preferably 500 mm or more, still more preferably 1000 mm or more. The upper limit is not particularly limited, but industrially, a length of 20000 mm or less is sufficient and the length may be 10000 mm or less. The diameter of the circumscribed circle of the inorganic substrate is preferably 310 mm or more. The diameter is more preferably 350 mm or more, still more preferably 400 mm or more since the laminate of the present invention can be packed in the form of a stack for storage and transportation when the laminate is large as well. Industrially, a diameter of 30,000 mm or less is sufficient, and the diameter may be 20,000 mm or less.

<Adhesive>

It is preferable that an adhesive layer is substantially not interposed between the inorganic substrate and heat-resistant polymer film layer of the present invention. Here, the adhesive layer in the present invention refers to a layer containing a Si (silicon) component at less than 10% as a mass ratio (less than 10% by mass). Substantially not used (not interposed) means that the thickness of the adhesive layer interposed between the inorganic substrate and the polymer film layer is preferably 0.4 µm or less, more preferably 0.3 µm or less, still more preferably 0.2 µm or less, particularly preferably 0.1 µm or less, most preferably 0 µm.

The timing of pasting the peeling auxiliary tape to the heat-resistant polymer film with protective film/inorganic substrate laminate (laminate precursor) may be immediately after the heat-resistant polymer film with protective film and the inorganic substrate are bonded together or may be after the heat-resistant polymer film with protective film/inorganic substrate laminate is heated.

EXAMPLES

Hereinafter, the present invention will be described more specifically with reference to Examples, but the present invention is not limited to the following Examples. The evaluation methods of physical properties in the following Examples are as follows.

<Heat-Resistant Polymer Film A1>

As the heat-resistant polymer film A1, XENOMAX (registered trademark) F15LR2 (polyimide film manufactured by TOYOBO CO., LTD., thickness: 15 µm) was used.

<Heat-Resistant Polymer Film A2>

While nitrogen gas was introduced into a reaction vessel equipped with a nitrogen introducing tube, a Dean-Stark tube and a reflux tube, a thermometer, and a stirring bar, 19.86 parts by mass of 4,4'-diaminodiphenyl sulfone (4,4'-DDS), 4.97 parts by mass of 3,3'-diaminodiphenyl sulfone (3,3'-DDS), and 80 parts by mass of γ-butyrolactone (GBL) were added. Subsequently, 31.02 parts by mass of 4,4'-oxydiphthalic dianhydride (ODPA), 24 parts by mass of GBL, and 13 parts by mass of toluene were added at room temperature, then the temperature was raised to an internal temperature of 160° C., and the mixture was heated under reflux at 160° C. for 1 hour for imidization. After the imidization was completed, the temperature was raised to 180° C., and the reaction was continuously conducted while extracting toluene. After the reaction for 12 hours, the oil bath was removed, the temperature was returned to room temperature, and GBL was added so that the solid concentration was 20% by mass, thereby obtaining a polyimide solution A1 having a reduced viscosity of 0.70 dl/g.

The obtained polyimide solution A1 was adjusted and applied onto the lubricant-free surface of polyethylene terephthalate film A4100 (support manufactured by TOYOBO CO., LTD.) using a comma coater so that the final film thickness was 25 µm. The polyethylene terephthalate film A04100 was allowed to pass through a hot air furnace, wound up, and dried at 100° C. for 10 minutes at this time. The polyimide film that gained self-supporting properties after drying was peeled off from the support, allowed to pass through a pin tenter with a pin sheet having pins disposed, and gripped by inserting the film edges into the pins, the pin sheet interval was adjusted so that the film did not break and unnecessary slackening did not occur, and the film was transported and heated at 200° C. for 3 minutes, at 250° C. for 3 minutes, and at 300° C. for 6 minutes to conduct the imidization reaction. Thereafter, the film was cooled to room temperature for 2 minutes, the portions exhibiting poor flatness at both edges of the film were cut off using a slitter, and the film was wound into a roll shape, thereby obtaining a polyimide film A2 having a width of 450 mm by 500 m.

<Heat-Resistant Polymer Film A3>

The inside of a reaction vessel equipped with a nitrogen introducing tube, a reflux tube, and a stirring bar was purged with nitrogen, then 33.36 parts by mass of 2,2'-bis(trifluoromethyl)benzidine (TFMB), 270.37 parts by mass of N-methyl-2-pyrrolidone (NMP), and a dispersion obtained by dispersing colloidal silica in dimethylacetamide ("SNOWTEX (registered trademark) DMAC-ST" manufactured by Nissan Chemical Corporation) were added so that silica was 0.14% by mass of the total amount of polymer solids in the polyamic acid solution, and completely dissolved. Subsequently, 9.81 parts by mass of 1,2,3,4-cyclobutanetetracarboxylic dianhydride (CBDA), 11.34 parts by mass of 3,3',4,4'-biphenyltetracarboxylic acid (BPDA), 4.85 parts by mass of 4,4'-oxydiphthalic dianhydride (ODPA) were added dividedly in the solid form, and the mixture was then stirred at room temperature for 24 hours. Thereafter, 165.7 parts by mass of DMAc was added for dilution, thereby obtaining a polyamic acid solution B1 having a solid content of 18% by mass and a reduced viscosity of 2.7 dl/g (molar ratio of TFMB//CBDA/BPDA/ODPA=1.00//0.48/0.37/0.15).

The obtained polyamic acid solution B1 was applied onto the lubricant-free surface of polyethylene terephthalate film A4100 (manufactured by TOYOBO CO., LTD.) using a comma coater so that the final film thickness was 25 µm. This was dried at 110° C. for 10 minutes. The polyamic acid film that gained self-supporting properties after drying was peeled off from the A4100 film that had served as a support, allowed to pass through a pin tenter with a pin sheet having pins disposed, and gripped by inserting the film edges into the pins, the pin sheet interval was adjusted so that the film did not break and unnecessary slackening did not occur, and the film was transported and heated at 200° C. for 3 minutes, at 250° C. for 3 minutes, at 300° C. for 3 minutes, and at 350° C. for 3 minutes to conduct the imidization reaction. Thereafter, the film was cooled to room temperature for 2 minutes, the portions exhibiting poor flatness at both edges of the film were cut off using a slitter, and the film was wound into a roll shape, thereby obtaining a polyimide film A3 having a width of 450 mm by 500 m.

<Protective Film PF1>

The following were mixed together to obtain a pressure sensitive adhesive composition C1.
  Linear polyorganosiloxane having vinyl groups only at both ends (solvent-free type, Mw: 80,000): 68.30 parts by mass
  Organohydrogenpolysiloxane (solvent-free type, Mw: 2,000): 0.41 parts by mass
  Platinum catalyst (manufactured by Shin-Etsu Chemical Co., Ltd., PL-56): 1.00 part by mass
  Ultraviolet absorber (Cyasorb UV-3638 (manufactured by CYTEC)): 0.3 parts by mass
  Reaction control agent (3-methyl-1-butyn-3-ol): 0.10 parts by mass
  Toluene: 30.19 parts by mass A polyethylene terephthalate (PET) film (A4100, thickness 50 µm) manufactured by TOYOBO CO., LTD. was subjected to corona treatment as surface preparation, and the pressure sensitive adhesive composition C1 was applied to the PET film immediately after the corona treatment. The application was performed in an environment of 25° C. and 85% RH so that the thickness after drying was 10 µm. After that, heating was performed in an oven at 150° C. for 100 seconds for crosslinking, thereby obtaining a pressure sensitive adhesive layer. As described above, a protective film PF1 was obtained.

<Protective Film PF2>

Into a separable flask, 55.3 parts by mass of polyol (trifunctional polyol obtained by addition polymerization of propylene oxide and ethylene oxide to glycerin, SANNIX (registered trademark) GL3000 manufactured by Sanyo Chemical Industries, Ltd.), 4.7 parts by mass of DURANATE D101 (polyisocyanate manufactured by Asahi Kasei Corporation), 39.7 parts by mass of toluene, and 0.02 parts by mass of dibutyltin dilaurate (DBTDL) were put, and heated at 45° C. to 55° C. for 2 hours while being stirred for reaction. After 2 hours from the start of heating, the mixture was cooled to 40° C. or less. After cooling, 0.28 parts by mass of an antioxidant was added, and the mixture was stirred until to be uniform, thereby obtaining a polyurethane polyol-containing composition 1. With 100 parts by mass of polyurethane polyol-containing composition 1, 7.7 parts by mass of DURANATE D101, 2 parts by mass of an ultraviolet absorber (Cyasorb UV-3638 (manufactured by CYTEC)), and 50 parts by mass of ethyl acetate were blended, and the mixture was thoroughly stirred. The obtained pressure sensitive adhesive composition was filtered through a PTFE cartridge filter (0.45 µm), thereby obtaining a pressure sensitive adhesive composition C2.

The pressure sensitive adhesive composition C2 was applied to a polyethylene terephthalate (PET) film (A4100) manufactured by TOYOBO CO., LTD., which had been previously subjected to corona treatment, so that the pressure sensitive adhesive film thickness when dried was 10 µm. After that, the coated film was dried by heating at 130° C. for 2 minutes and then allowed to still stand in a thermostatic chamber at 40° C. for 3 days (aging process), and the pressure sensitive adhesive was cured (crosslinked), thereby fabricating a protective film PF2.

<Protective Film PF3>

To 100 parts by weight of acrylic-based polymer (copolymer of 2-ethylhexyl acrylate and 4-hydroxybutyl acrylate (copolymerization ratio 100:8), weight average molecular weight: 200,000), 1.5 parts by weight of CORONATE HX (manufactured by Tosoh Corporation, polyisocyanate for paint) as a polyfunctional isocyanate and 0.3 parts by weight of KP-341 (trade name, manufactured by Shin-Etsu Chemical Co., Ltd., polyether-modified organosiloxane) as a modified organosiloxane were added, and the mixture was stirred and mixed to obtain a pressure sensitive adhesive composition C3.

The obtained pressure sensitive adhesive composition C3 was applied onto a polyethylene terephthalate (PET) film (A4100) manufactured by TOYOBO CO., LTD., which had been previously subjected to corona treatment, and dried at 100° C. to remove the solvent, thereby obtaining a surface protection film PF3 in which a pressure sensitive adhesive layer having a thickness of 10 µm was formed on a PET film.

<Protective Film PF4>

While 100 parts by mass of urethane-based solvent type pressure sensitive adhesive US-902-50 (manufactured by Lion Specialty Chemicals Co., Ltd., ethyl acetate solvent, solid content: 50% by mass) was stirred, 5.4 parts by mass of Crosslinking Agent N (manufactured by Lion Specialty Chemicals Co., Ltd.) and 2 parts by mass of an ultraviolet absorber (Cyasorb UV-3638 (manufactured by CYTEC)) were added, and the reaction was conducted at 40° C. for 20 minutes. The obtained solution was filtered through a PTFE cartridge filter (0.45 µm), and then applied onto a polyethylene terephthalate (PET) film (A4100) manufactured by TOYOBO CO., LTD., which had been previously subjected to corona treatment, so that the final film thickness was 10 µm, and heated at 100° C. for 2 minutes to obtain a protective film PF4.

<Protective Film PF5>

As the protective film PF5, TORETEC (registered trademark) 7832C manufactured by TORAY ADVANCED FILM CO., LTD. was used.

<Protective Film PF6>

The following were mixed together to obtain a pressure sensitive adhesive composition.

Linear polyorganosiloxane having vinyl groups only at both ends (solvent-free type, Mw: 80,000): 68.30 parts by mass Organohydrogenpolysiloxane (solvent-free type, Mw: 2,000): 0.41 parts by mass Platinum catalyst (manufactured by Shin-Etsu Chemical Co., Ltd., PL-56): 1.00 part by mass Reaction control agent (3-methyl-1-butyn-3-ol): 0.10 parts by mass Toluene: 30.19 parts by mass COSMOSHINE SRF (registered trademark, TA044, 80 µm) manufactured by TOYOBO CO., LTD. was subjected to corona treatment as surface preparation, and coated with the pressure sensitive adhesive composition immediately after the corona treatment. The application was performed in an environment of 25° C. and 85% RH so that the thickness after drying was 10 µm. After that, heating was performed in an oven at 150° C. for 100 seconds for crosslinking, thereby obtaining a pressure sensitive adhesive layer. As described above, a protective film PF6 was obtained.

<Protective Film PF7>

A protective film PF7 was fabricated in the same manner as the protective film PF6 except that ESTER (registered trademark) Film (HB3, 50 µm) manufactured by TOYOBO CO., LTD. was used as the base material.

<Protective Film Peeling Auxiliary Tape S1>

Sun A Kaken Co., Ltd. SUNYTECT (registered trademark) SAT type was cut into a length of 300 mm and a width of 150 mm. A polyethylene terephthalate (PET) film (12 µm, E5100) manufactured by TOYOBO CO., LTD. having a length of 300 mm and a width of 50 mm was bonded to the pressure sensitive adhesive surface to obtain a protective film peeling auxiliary tape S1 having a pressure sensitive adhesive surface exposed by a length of 300 mm and a width of 100 mm.

<Protective Film Peeling Auxiliary Tape S2>

PF1 was cut into a length of 300 mm and a width of 150 mm. A polyethylene terephthalate (PET) film (12 µm, E5100) manufactured by TOYOBO CO., LTD. having a length of 300 mm and a width of 50 mm was bonded to the pressure sensitive adhesive surface to obtain a protective film peeling auxiliary tape S2 having a pressure sensitive adhesive surface exposed by a length of 300 mm and a width of 100 mm.

<Protective Film Peeling Auxiliary Tape S3>

A protective film peeling auxiliary tape S3 was obtained in the same manner as S2 except that PF2 was used instead of PF1.

<Protective Film Peeling Auxiliary Tape S4>

A protective film peeling auxiliary tape S4 was obtained in the same manner as S2 except that PF3 was used instead of PF1.

<Fabrication of Laminate>

Example 1

First, a glass substrate was prepared as an inorganic substrate. The glass substrate is 0.7 mm thick OA10G glass (manufactured by NEG Co., Ltd.) cut into a size of 500 mm×500 mm. The glass substrate was washed with pure water, dried, then irradiated using a UV/O$_3$ irradiator (SKR1102N-03 manufactured by LANTECHNICAL SERVICE CO., LTD.) for 1 minute for cleaning, and used. Next, a silane coupling agent (SCA) was applied onto the glass substrate by a vapor phase coating method to form a silane coupling agent layer, thereby obtaining a first laminate. Specifically, the application of the silane coupling agent to the glass substrate was performed using the experimental apparatus illustrated in FIG. 3. FIG. 3 is a schematic diagram of an experimental apparatus for applying a silane coupling agent to a glass substrate. Into a chemical tank having a capacity of 1 L, 130 g of 3-aminopropyltrimethoxysilane (KBM-903 manufactured by Shin-Etsu Chemical Co., Ltd.) was put, and the outer water bath of this chemical tank was warmed to 42° C. The vapor that came out was then sent to the chamber together with clean dry air. The gas flow rate was set to 22 L/min and the substrate temperature was set to 21° C. The temperature of clean dry air was 23° C. and the humidity thereof was 1.2% RH. Since the exhaust is connected to the exhaust port having a negative pressure, it is confirmed that the chamber has a negative pressure of about 2 Pa by a differential pressure gauge.

First, PF1 was pasted to both surfaces of polyimide film A1, and the film was cut into 300 mm×300 mm. The protective film on the surface to be bonded to the support (glass substrate) was peeled off. The reason why PF1 was temporarily pasted to the surface to be bonded to the glass substrate is to prevent scratches and attachment of foreign matter during the cutting process. The silane coupling agent layer of the glass substrate treated with a silane coupling agent and the heat-resistant polymer film surface of the heat-resistant polymer film with protective film were bonded together to obtain a laminate in which a glass substrate, a silane coupling agent layer, a heat-resistant polymer film, and a protective film were laminated in this order. A laminator (MRK-1000 manufactured by MCK CO., LTD.) was used for bonding, and the bonding conditions were set to air source pressure: 0.7 MPa, temperature: 22° C., humidity: 55% RH, and lamination speed: 50 mm/sec.

The obtained heat-resistant polymer film with protective film/glass substrate laminate was heated in the air at 120° C. for 10 minutes using an oven. A peeling auxiliary tape was pasted to the obtained laminate precursor as illustrated in FIG. 1(b), thereby obtaining a peeling auxiliary tape/protective film/heat-resistant polymer film/glass substrate laminate.

Samples for Examples 2 to 9 and Comparative Examples 1 to 3 were fabricated in the same manner by changing the combination of heat-resistant polymer film, protective film, and peeling auxiliary tape used. The combinations are presented in Table 1.

TABLE 1

|  | Example 1 | Example 2 | Example 3 | Example 4 | Example 5 | Example 6 | Example 7 | Example 8 | Example 9 | Comparative Example 1 | Comparative Example 2 | Comparative Example 3 |
|---|---|---|---|---|---|---|---|---|---|---|---|---|
| Heat-resistant polymer film | A1 | A1 | A1 | A1 | A2 | A3 | A1 | A1 | A1 | A1 | A1 | A1 |
| Protective film | PF1 | PF2 | PF3 | PF1 | PF1 | PF1 | PF5 | PF6 | PF7 | PF3 | PF2 | PF4 |
| Protective film peeling auxiliary tape | S1 | S1 | S1 | PF3 | S1 | S1 | S1 | S1 | S1 | PF1 | PF2 | PF2 |
| F1 (N/cm) after heating at 120° C. | 0.11 | 0.11 | 0.11 | 0.11 | 0.14 | 0.1 | 0.11 | 0.11 | 0.11 | 0.11 | 0.11 | 0.11 |
| F2 (N/cm) before heating at 120° C. | 0.002 | 0.01 | 0.055 | 0.002 | 0.002 | 0.002 | 0.004 | 0.003 | 0.003 | 0.058 | 0.01 | 0.04 |
| F3 (N/cm) | 0.2 | 0.2 | 0.2 | 0.15 | 0.2 | 0.2 | 0.2 | 0.2 | 0.2 | 0.003 | 0.01 | 0.08 |
| F2 (N/cm) after heating at 120° C. | 0.002 | 0.01 | 0.054 | 0.003 | 0.002 | 0.002 | 0.005 | 0.003 | 0.003 | 0.054 | 0.011 | 0.07 |
| F3 > F1 > F2 | ○ | ○ | ○ | ○ | ○ | ○ | ○ | ○ | ○ | X | X | X |
| F2 change rate by heating (%) | 0 | 0 | −2 | 50 | 0 | 0 | 25 | 0 | 0 | −7 | 10 | 50 |
| Possibility of PF peeling off | ○ | ○ | ○ | ○ | ○ | ○ | ○ | ○ | ○ | X | X | X |
| 50% cutoff wavelength of protective film (nm) | 390 | 391 | 390 | 390 | 390 | 390 | 208 | 386 | 388 | 390 | 391 | 392 |
| Area B1 of protective film (m2) | 0.09 | 0.09 | 0.09 | 0.09 | 0.09 | 0.09 | 0.09 | 0.09 | 0.09 | 0.09 | 0.09 | 0.09 |
| Area B2 of peeling auxiliary tape (m2) | 0.045 | 0.023 | 0.045 | 0.045 | 0.023 | 0.023 | 0.045 | 0.045 | 0.045 | 0.045 | 0.045 | 0.045 |
| Protective film peeling surface Wa (nm) | 12.4 | 22 | 28.1 | 12.4 | 12.4 | 12.4 | 31 | 8.5 | 8.1 | 28.1 | 22 | 25 |
| Laser cut quality | ○ | ○ | ○ | ○ | ○ | ○ | Δ | ○ | ○ | ○ | ○ | ○ |

<90° Peel Strength>

The 90° peel strength of each layer of the laminate obtained as described above was measured under the following conditions.

Peeling off of inorganic substrate/heat-resistant polymer film and heat-resistant polymer film/protective film was performed after heating at 120° C. for 10 minutes, and peeling off of heat-resistant polymer film/protective film (before heating) and the protective film/protective film peeling auxiliary tape was performed in an unheated state. In a case where it was not possible to peel off only the target layer, the measurement was carried out by firmly fixing the lower layer using tape. The results are presented in Table 1.

Measuring instrument: Autograph AG-IS manufactured by Shimadzu Corporation

Measured temperature: Room temperature (25° C.)

Peeling speed: 100 mm/min

Atmosphere: Air

Width of measured sample: 5 cm

The measurement is performed 5 times and the average value thereof is taken as the measured value.

It was evaluated as ○ in a case where F3>F1>F2 (1) was satisfied, and as x in a case where F3>F1>F2 (1) was not satisfied.

<Possibility of Protective Film Peeling Off>

The glass of peeling auxiliary tape/protective film/heat-resistant polymer film/glass substrate laminate was fixed to the workbench using double-sided tape. The peeling auxiliary tape was grasped, and peeling off was performed at an angle of about 180°. It was evaluated as ○ in a case where the protective film was peeled off from the heat-resistant polymer film without peeling off the heat-resistant polymer film and the glass substrate, and as x in a case where the heat-resistant polymer film and the glass were peeled off or a case where only the protective film peeling auxiliary tape was peeled off. The results are presented in Table 1.

<Ultraviolet (UV) 50% Cutoff Wavelength of Protective Film>

UV transmittance measurement was performed on the protective films PF1 to PF7. Specifically, UV transmittance measurement was performed by a transmission method using UV-3150 manufactured by Shimadzu Corporation. The wavelength at which the transmittance was 50% was taken as the ultraviolet 50% cutoff wavelength. The results are presented in Table 1.

<Wa of Surface Pasted to Heat-Resistant Polymer Film of Protective Film>

The surface shape of the surface pasted to the heat-resistant polymer film of the protective film was measured at a magnification of 5× using scanning white light interference microscope VS1800 manufactured by Hitachi High-Tech Corporation. For the measurement, the protective film was peeled off from the heat-resistant polymer film at an angle of 90° at 100 mm/min, and the heat-resistant polymer film was allowed to still stand for 5 minutes and used. The measurement range obtained is 1404 μm in the x direction and 1872 μm in the y direction. The arithmetic mean waviness Wa was obtained using a waviness analysis function with a cut-off value of 20 μm.

<Laser-Cut Quality of Heat-Resistant Polymer Film with Protective Film>

Each of the fabricated heat-resistant polymer films with protective film was irradiated with an ultraviolet laser from the protective film side so as to have a size of 100 mm×100 mm. The ultraviolet laser irradiation was performed in a state where the protective film was not peeled off from the heat-resistant polymer film. The ultraviolet laser used was a pulsed laser with a wavelength of 355 nm manufactured by Takei Electric Industries Co., Ltd. The same place was scanned three times at an electric power of 8.5 W, a pulse frequency of 1000 kHz, and a scanning speed of 500 mm/sec. The first protective film and the polyimide film were thus cut into a size of 100 mm×100 mm.

The laser-cut edge of the heat-resistant polymer film with protective film after cutting was observed under a microscope, and the width from the edge to the place where a black powdery substance (smear) existed was measured. It was evaluated as ○ in a case where the smear width was 300 µm or less, as Δ in a case where the smear width was more than 300 µm and 500 µm or less, and as x in a case where the smear width was larger than 500 µm. The results are presented in Table 1.

INDUSTRIAL APPLICABILITY

As described above, the laminate (inorganic substrate/heat-resistant polymer film/protective film/protective film peeling auxiliary tape laminate) of the present invention can be handled in a state where the surface of the heat-resistant polymer film is protected by the protective film, and further the protective film can be peeled off without any problem in a case where the surface of the heat-resistant polymer film is processed. The present invention can be usefully utilized for manufacture of flexible devices and the like in which microfabrication is performed on the polymer film using such a laminate and then the polymer film is peeled off from the inorganic substrate. In particular, the present invention can be effectively utilized for display applications with a large laminate size, and the like, for which automation of peeling off of the protective film is essential.

DESCRIPTION OF REFERENCE SIGNS

11 Protective film peeling auxiliary tape
12 Inorganic substrate
13 Protective film
14 Heat-resistant polymer film
15 Pressure sensitive adhesive layer of protective film peeling auxiliary tape
16 Base material of protective film peeling auxiliary tape
17 Pressure sensitive adhesive layer coating film of protective film peeling auxiliary tape
31 Flow meter
32 Gas inlet
33 Chemical tank (silane coupling agent tank)
34 Hot water tank (water bath)
35 Heater
36 Processing chamber (chamber)
37 Substrate
38 Exhaust port

The invention claimed is:

1. A laminate comprising an inorganic substrate, a heat-resistant polymer film, a protective film, and a protective film peeling auxiliary tape in this order,
   wherein
   adhesive strength F1 between the inorganic substrate and the heat-resistant polymer film by a 90-degree peeling method,
   adhesive strength F2 between the heat-resistant polymer film and the protective film by a 90-degree peeling method, and
   adhesive strength F3 between the protective film and the protective film peeling auxiliary tape by a 90-degree peeling method
   satisfy relation of F3>F1>F2 (1).

2. The laminate according to claim 1, wherein an ultraviolet 50% cutoff wavelength of the protective film is 240 nm or more.

3. The laminate according to claim 1, wherein a change rate of F2 after heating of the laminate at 120° C. for 10 minutes is 50% or less.

4. The laminate according to claim 1, wherein an area B1 of the protective film and an area B2 of the protective film peeling auxiliary tape satisfy relation of B1>B2.

5. The laminate according to claim 1, wherein an arithmetic mean waviness Wa of a surface of the protective film in contact with the heat-resistant polymer film is 30 nm or less.

6. The laminate according to claim 1, wherein the heat-resistant polymer film includes at least one selected from the group consisting of polyimide, polyamide, and polyamide-imide.

7. The laminate according to claim 1, wherein the heat-resistant polymer film is transparent polyimide.

* * * * *